United States Patent
Abe et al.

(10) Patent No.: US 11,050,005 B2
(45) Date of Patent: Jun. 29, 2021

(54) PHOSPHOR AND LIGHT EMITTING DEVICE

(71) Applicant: Panasonic Intellectual Property Management Co., Ltd., Osaka (JP)

(72) Inventors: Takeshi Abe, Osaka (JP); Shozo Oshio, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 341 days.

(21) Appl. No.: 16/072,532

(22) PCT Filed: Mar. 6, 2017

(86) PCT No.: PCT/JP2017/008758
§ 371 (c)(1),
(2) Date: Jul. 25, 2018

(87) PCT Pub. No.: WO2017/154830
PCT Pub. Date: Sep. 14, 2017

(65) Prior Publication Data
US 2019/0035983 A1  Jan. 31, 2019

(30) Foreign Application Priority Data
Mar. 8, 2016 (JP) .............................. JP2016-044532

(51) Int. Cl.
*C09K 11/77* (2006.01)
*H01L 33/50* (2010.01)
*H01S 5/02* (2006.01)

(52) U.S. Cl.
CPC ........ *H01L 33/504* (2013.01); *C09K 11/7774* (2013.01); *C09K 11/7792* (2013.01);
(Continued)

(58) Field of Classification Search
CPC ........ C09K 11/77742; C09K 11/77744; C09K 11/7774
See application file for complete search history.

(56) References Cited

U.S. PATENT DOCUMENTS

2005/0093442 A1  5/2005  Setlur
2007/0091950 A1*  4/2007  Takata ............... C01B 13/14
                                                    372/39
(Continued)

FOREIGN PATENT DOCUMENTS

CN  103904195 A  7/2014
CN  104250555 A  12/2014
(Continued)

OTHER PUBLICATIONS

Official Action dated Feb. 22, 2019 in corresponding European Patent Application No. 17763170.2.
(Continued)

*Primary Examiner* — Matthew E. Hoban
(74) *Attorney, Agent, or Firm* — Renner, Otto, Boisselle & Sklar, LLP

(57) ABSTRACT

A phosphor composed by containing $Ce^{3+}$ as a light emission center in a matrix garnet compound having a garnet structure. The matrix garnet compound is a solid solution composed of two or more end members, and the end members include $Lu_2CaMg_2(SiO_4)_3$ as a first end member. It is preferable that the matrix garnet compound is a compound containing Al. A light emitting device uses the phosphor 2 and includes a solid-state light emitting device 117. The phosphor 2 is excited by light radiated by the solid-state light emitting device 117.

8 Claims, 12 Drawing Sheets

(52) U.S. Cl.
CPC ............ *H01L 33/50* (2013.01); *H01L 33/505* (2013.01); *H01S 5/02* (2013.01); *H01L 2933/0041* (2013.01)

(56) References Cited

U.S. PATENT DOCUMENTS

2011/0309398 A1  12/2011  Ito et al.
2015/0344775 A1  12/2015  Oshio

FOREIGN PATENT DOCUMENTS

| | | |
|---|---|---|
| JP | 3503139 | 12/2003 |
| JP | 2007-510040 A | 4/2007 |
| JP | 2007-112951 A | 5/2007 |
| JP | 2014-210684 A | 11/2014 |
| WO | 2010-043287 | 4/2010 |
| WO | 2014/097527 A1 | 6/2014 |

OTHER PUBLICATIONS

International Search Report for corresponding App. No. PCT/JP2017/008758, dated Apr. 11, 2017.
Written Opinion for corresponding App. No. PCT/JP2017/008758, dated Apr. 11, 2017.
Prasanth, Kumar N., Controlling Ce3+ Emission Color in Silicate Garnet Phosphor. ECS Transactions, 16(30), 57-64 (2009).

\* cited by examiner

PHOSPHOR AND LIGHT EMITTING DEVICE

TECHNICAL FIELD

The present invention relates to a novel garnet phosphor that is used together with a solid-state light emitting device, for example, such as a semiconductor laser diode (LD) and is widely usable as a phosphor to be used for a light source of a display device such as a projector or of a lighting device, and relates to a light emitting device using this phosphor.

BACKGROUND ART

Heretofore, compounds having a crystal structure called a "garnet structure" have been known. As one of the compounds having the garnet structure, a compound represented by $Y_3Al_2(AlO_4)_3$ has been known. This $Y_3Al_2(AlO_4)_3$ has been widely known by an abbreviation that is yttrium aluminum garnet (YAG). This $Y_3Al_2(AlO_4)_3$ has been used for a solid-state laser, translucent ceramics, a phosphor and the like.

Here, the phosphor is a compound that radiates fluorescence by being given a stimulation such as ultraviolet excitation. In the phosphor, when extranuclear electrons of specific atoms which compose the phosphor return to a ground state after being excited by an ultraviolet ray and the like, a difference in energy level between an excited state and the ground state is emitted as visible light. For example, the phosphor is obtained by containing rare earth ions or transition metal ions ($Ce^{3+}$, $Tb^{3+}$, $Eu^{3+}$, $Mn^{2+}$, $Mn^{4+}$, $Fe^{3+}$, $Cr^{3+}$ or the like) as a light emission center in the compound such as $Y_3Al_2(AlO_4)_3$, which has the garnet structure.

Hereinafter, in this description, such a phosphor composed by containing the rare earth ions or the transition metal ions ($Ce^{3+}$, $Tb^{3+}$, $Eu^{3+}$, $Mn^{2+}$, $Mn^{4+}$, $Fe^{3+}$, $Cr^{3+}$ or the like) as a light emission center in the compound having the garnet structure is also referred to as a garnet phosphor. Note that, in this description, the garnet phosphor is simply referred to as a phosphor in some cases.

Moreover, such a phosphor composed by containing the rare earth ions or the transition metal ions ($Ce^{3+}$, $Tb^{3+}$, $Eu^{3+}$, $Mn^{2+}$, $Mn^{4+}$, $Fe^{3+}$, $Cr^{3+}$ or the like) as a light emission center in $Y_3Al_2(AlO_4)_3$ having the garnet structure is also referred to as a $Y_3Al_2(AlO_4)_3$ phosphor.

Furthermore, for convenience, a $Y_3Al_2(AlO_4)_3$ phosphor containing at least $Ce^{3+}$ as a light emission center is also referred to as a $Y_3Al_2(AlO_4)_3:Ce^{3+}$ phosphor.

It is known that the $Y_3Al_2(AlO_4)_3:Ce^{3+}$ phosphor is excited when being irradiated with a particle beam or an electromagnetic wave, such as an electron beam, a vacuum ultraviolet ray and blue light, and then radiates yellow green visible light. Moreover, it is also known that the $Y_3Al_2(AlO_4)_3:Ce^{3+}$ phosphor has a $1/10$ afterglow time as extremely short as 100 ns or less. Therefore, the $Y_3Al_2(AlO_4)_3:Ce^{3+}$ phosphor is widely used for a large number of light emitting devices.

As described above, a light color of the light radiated by the $Y_3Al_2(AlO_4)_3:Ce^{3+}$ phosphor is yellow green. It is known that, in contrast, when a part or all of the elements which compose the $Y_3Al_2(AlO_4)_3:Ce^{3+}$ phosphor are replaced by another element different in ionic radius, a phosphor that radiates a different light color from that of the $Y_3Al_2(AlO_4)_3:Ce^{3+}$ phosphor is obtained.

For example, as a garnet phosphor that radiates a light color with a shorter wavelength than that of the $Y_3Al_2(AlO_4)_3:Ce^{3+}$ phosphor, there is known a $Lu_3Al_2(AlO_4)_3:Ce^{3+}$ phosphor in which Y that composes the $Y_3Al_2(AlO_4)_3:Ce^{3+}$ phosphor is replaced by Lu. The $Lu_3Al_2(AlO_4)_3:Ce^{3+}$ phosphor radiates green visible light. That is, a light emission peak wavelength of the $Lu_3Al_2(AlO_4)_3:Ce^{3+}$ phosphor is relatively shorter than a light emission peak wavelength of the $Y_3Al_2(AlO_4)_3:Ce^{3+}$ phosphor.

Meanwhile, there is known a garnet phosphor that radiates a light color with a longer wavelength than that of the $Y_3Al_2(AlO_4)_3:Ce^{3+}$ phosphor (for example, refer to PTL 1). This garnet phosphor is a $(Y,Gd)_3Al_2(AlO_4)_3:Ce^{3+}$ phosphor in which a part of Y that composes the $Y_3Al_2(AlO_4)_3:Ce^{3+}$ phosphor is replaced by Gd. The $(Y,Gd)_3Al_2(AlO_4)_3:Ce^{3+}$ phosphor radiates yellow green to orange visible light.

Moreover, there is also known another garnet phosphor that radiates a light color with a longer wavelength than that of the $Y_3Al_2(AlO_4)_3:Ce^{3+}$ phosphor (for example, refer to PTL 2). This garnet phosphor is a $Y_3(Al,Mg)_2((Al,Si)O_4)_3:Ce^{3+}$ phosphor, in which a part or all of Al that composes the $Y_3Al_2(AlO_4)_3:Ce^{3+}$ phosphor is replaced by Mg, and a part or all of the $(AlO_4)$ group is replaced by a $(SiO_4)$ group. The $Y_3(Al,Mg)_2((Al,Si)O_4)_3:Ce^{3+}$ phosphor radiates yellow green to red visible light.

Furthermore, there is also known another garnet phosphor that radiates a light color with a longer wavelength than that of the $Y_3Al_2(AlO_4)_3:Ce^{3+}$ phosphor (for example, refer to PTL 3). This garnet phosphor is a $Lu_2CaMg_2(SiO_4)_3:Ce^{3+}$ phosphor, in which Y that composes the $Y_3Al_2(AlO_4)_3:Ce^{3+}$ phosphor is replaced by Lu and Ca, Al that composes the $Y_3Al_2(AlO_4)_3:Ce^{3+}$ phosphor is replaced by Mg, and the $(AlO_4)$ group that composes the $Y_3Al_2(AlO_4)_3:Ce^{3+}$ phosphor is replaced by the $(SiO_4)$ group. The $Lu_2CaMg_2(SiO_4)_3:Ce^{3+}$ phosphor radiates orange visible light.

These garnet phosphors in each of which the light emission peak wavelength is relatively longer than that of the $Y_3Al_2(AlO_4)_3:Ce^{3+}$ phosphor are superior to the $Y_3Al_2(AlO_4)_3:Ce^{3+}$ phosphor in terms of the tone, and accordingly, application thereof to the light emitting device and the like is on study.

CITATION LIST

Patent Literature

PTL 1: Japanese Patent No. 3503139
PTL 2: International Publication No. 2010/043287
PTL 3: English translation of Japanese Unexamined Patent Application Publication No. 2007-510040

SUMMARY OF INVENTION

Technical Problem

However, the garnet phosphors in each of which the light emission peak wavelength is relatively longer than that of the $Y_3Al_2(AlO_4)_3:Ce^{3+}$ phosphor have had a problem that temperature quenching is large. Herein, the temperature quenching is a phenomenon that light emission efficiency decreases as a temperature of the phosphor rises.

The present invention has been made in order to solve the above problem. It is an object of the present invention to provide a novel garnet phosphor, in which the light emission peak wavelength is relatively long, and the temperature quenching is improved, and to provide a light emitting device using the novel garnet phosphor.

Solution to Problem

In order to solve the above problem, a phosphor according to a first aspect of the present invention is a phosphor composed by containing $Ce^{3+}$ as a light emission center in a matrix garnet compound having a garnet structure, in which the matrix garnet compound is a solid solution composed of two or more end members. The end members include $Lu_2CaMg_2(SiO_4)_3$ as a first end member.

Moreover, a light emitting device according to a second aspect of the present invention uses the phosphor.

DESCRIPTION OF EMBODIMENTS

Figure 1:
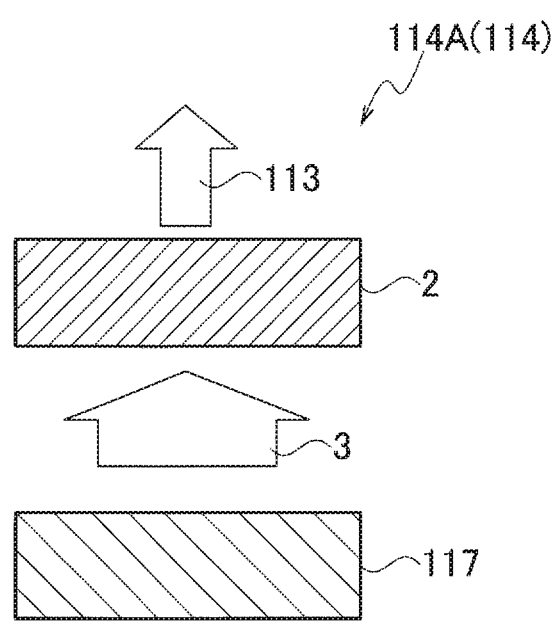
FIG. 1 is a diagram schematically showing a light emitting device according to a first embodiment.

Hereinafter, a detailed description will be given of a phosphor according to an embodiment and a light emitting device using the phosphor. Note that dimensional ratios in the drawings are exaggerated for convenience of explanation, and are sometimes different from actual ratios.
[Phosphor]

First, a description will be given of the phosphor according to the embodiment.

The phosphor according to this embodiment is a phosphor composed by containing $Ce^{3+}$ as a light emission center in a matrix garnet compound having a garnet structure.

In a similar way to the matrix garnet compound, the phosphor according to this embodiment has a garnet structure. Therefore, the phosphor according to this embodiment is a so-called garnet phosphor.

(Matrix Garnet Compound)

The matrix garnet compound is a compound that has the garnet structure and serves as a matrix containing $Ce^{3+}$ as a light emission center. Herein, the garnet structure is a crystal structure represented by $A_3B_2(CO_4)_3$ (where, A, B and C are elements). The matrix garnet compound is a solid solution composed of two or more end members.

The two or more end members which compose the solid solution that is the matrix garnet compound include $Lu_2CaMg_2(SiO_4)_3$ as an essential first end member. Moreover, it is preferable that the two or more end members which compose the solid solution include $Y_3Al_2(AlO_4)_3$ as an arbitrary second end member. Furthermore, it is preferable that the two or more end members which compose the solid solution include $Lu_3Al_2(AlO_4)_3$ as an arbitrary third end member.

That is, at least the first end member is included as the two or more end members which compose the solid solution that is the matrix garnet compound. Moreover, one or more selected from the second end member and the third end member are included as the arbitrary end members to be combined with the first end member. Note that both the second end member and the third end member may be included in the end members which compose the solid solution. Hereinafter, a detailed description will be given of the first end member, the second end member and the third end member.

<First End Member: $Lu_2CaMg_2(SiO_4)_3$>

$Lu_2CaMg_2(SiO_4)_3$ that is the first end member is an essential end member for the matrix garnet compound. If the matrix garnet compound is the solid solution containing the first end member, then the obtained phosphor is easy to become a novel phosphor, in which a light emission peak wavelength is relatively long, and temperature quenching is improved.

If the solid solution that is the matrix garnet compound includes an end member containing Al in addition to the first end member that is the essential end member, then the obtained phosphor becomes a garnet phosphor in which the temperature quenching is further improved. As the end member containing Al, for example, $Y_3Al_2(AlO_4)_3$ as the second end member and $Lu_3Al_2(AlO_4)_3$ as the third end member are used.

<Second End Member: $Y_3Al_2(AlO_4)_3$>

$Y_3Al_2(AlO_4)_3$ that is the second end member is an arbitrary end member to be used together with the first end member $Lu_2CaMg_2(SiO_4)_3$. If the matrix garnet compound is the solid solution containing the second end member, then the obtained phosphor is easy to become a phosphor, in which a light emission peak wavelength is relatively longer than that of $Y_3Al_2(AlO_4)_3:Ce^{3+}$, and temperature quenching is improved in comparison with other garnet phosphors which emit the same light color. This phosphor is a novel phosphor.

<Third End Member: $Lu_3Al_2(AlO_4)_3$>

$Lu_3Al_2(AlO_4)_3$ that is the third end member is an arbitrary end member to be used together with the first end member $Lu_2CaMg_2(SiO_4)_3$. If the matrix garnet compound is the solid solution containing the third end member, then the obtained phosphor is easy to become the phosphor, in which the light emission peak wavelength is relatively longer than that of $Lu_3Al_2(AlO_4)_3:Ce^{3+}$, and the temperature quenching is improved in comparison with other garnet phosphors which emit the same light color. This phosphor is a novel phosphor.

<Solid Solution>

The matrix garnet compound is such a solid solution containing the above first end member $Lu_2CaMg_2(SiO_4)_3$ as an essential end member. Moreover, the matrix garnet compound is such a solid solution containing at least one end member other than the first end member in addition to the first end member. If this end member other than the first end member is the end member containing Al, then the obtained phosphor is easy to become a garnet phosphor in which the temperature quenching is further improved in comparison with the other garnet phosphors which emit the same light color.

When the matrix garnet compound is a solid solution containing, as end members, the first end member $Lu_2CaMg_2(SiO_4)_3$ and an end member containing Al, the matrix garnet compound usually becomes a compound containing Al. As described above, if the matrix garnet compound is a compound containing Al, then the obtained phosphor is easy to become such a garnet phosphor in which the temperature quenching is further improved in comparison with the other garnet phosphors which emit the same light color.

As the end member containing Al, for example, the second end member and the third end member are preferable. With regard to the second end member and the third end member, either one or both of the end members are combined with the first end member to then form such a solid solution, whereby the matrix garnet compound is obtained. That is, as the solid solution that composes the matrix garnet compound, for example, there are used: a solid solution containing the first end member and the second end member as the end members; and a solid solution containing the first end member and the third end member as the end members. Moreover, as the solid solution that composes the matrix garnet compound, for example, a solid solution containing the first end member, the second end member and the third end member can also be used. Hereinafter, specific examples of the solid solution that composes the matrix garnet compound will be described.

[First Solid Solution]

The matrix garnet compound that is the solid solution containing the first end member as an essential end member includes, for example, a solid solution represented by a general formula (1):

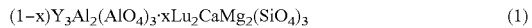

(where x is a numerical value that satisfies 0<x<1).

The solid solution represented by the general formula (1) is a solid solution of the first end member $Lu_2CaMg_2(SiO_4)_3$ and the second end member $Y_3Al_2(AlO_4)_3$. If the matrix garnet compound is the solid solution represented by the general formula (1), then the obtained phosphor is easy to become such a phosphor, in which the light emission peak wavelength is relatively longer than that of $Y_3Al_2(AlO_4)_3$:$Ce^{3+}$, and the temperature quenching is improved in comparison with the other garnet phosphors which emit the same light color. This phosphor is a novel phosphor.

In the general formula (1), x is usually 0<x<1, preferably $0.1 \leq x \leq 0.9$, more preferably $0.5 \leq x \leq 0.9$. If x in the general formula (1) remains within the above range, then the obtained phosphor is easy to become such a phosphor, in which the light emission peak wavelength is relatively much longer than that of $Y_3Al_2(AlO_4)_3$:$Ce^{3+}$, and the temperature quenching is further improved in comparison with the other garnet phosphors which emit the same light color.

[Second Solid Solution]

The matrix garnet compound that is the solid solution containing the first end member as an essential end member includes, for example, a solid solution represented by a general formula (2):

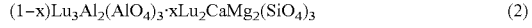

(where x is a numerical value that satisfies 0<x<1).

The solid solution represented by the general formula (2) is a solid solution of the first end member $Lu_2CaMg_2(SiO_4)_3$ and the third end member $Lu_3Al_2(AlO_4)_3$. If the matrix garnet compound is the solid solution represented by the general formula (2), then the obtained phosphor is easy to become such a phosphor, in which the light emission peak wavelength is relatively longer than that of $Lu_3Al_2(AlO_4)_3$:$Ce^{3+}$, and the temperature quenching is improved in comparison with the other garnet phosphors which emit the same light color. This phosphor is a novel phosphor.

In the general formula (2), x is usually 0<x<1, preferably $0.1 \leq x \leq 0.9$, more preferably $0.5 \leq x \leq 0.9$. If x in the general formula (2) remains within the above range, then the obtained phosphor is easy to become such a phosphor, in which the light emission peak wavelength is relatively much longer than that of $Lu_3Al_2(AlO_4)_3$:$Ce^{3+}$, and the temperature quenching is further improved in comparison with the other garnet phosphors which emit the same light color.

In this embodiment, in the case where the matrix garnet compound is the compound containing Al, a part of Ca that composes the matrix garnet compound may be replaced by Mg. If a part of Ca that composes the matrix garnet compound may be replaced by Mg in the case where the matrix garnet compound is the compound containing Al, then this is preferable since the obtained phosphor becomes the garnet phosphor in which the temperature quenching is further improved. Such a matrix garnet compound as described above includes, for example, a compound in which a part of Ca of the matrix garnet compound that is the solid solution represented by the general formula (2) is replaced by Mg. Moreover, in the case where the matrix garnet compound is the compound containing Al, also when the end member includes $Lu_3Al_2(AlO_4)_3$ as the third end member, a part of Ca that composes the matrix garnet compound may be replaced by Mg. Also in this case, the obtained phosphor becomes the garnet phosphor in which the temperature quenching is further improved, and therefore, this is preferable.

(Composition of Phosphor)

The phosphor according to this embodiment is such a phosphor composed by containing $Ce^{3+}$ as a light emission center in the above matrix garnet compound.

A composition of the phosphor in which $Ce^{3+}$ is contained in the matrix garnet compound includes, for example, a compound represented by a general formula (3):

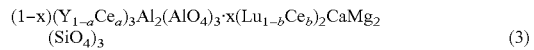

(where x is a numerical value that satisfies 0<x<1, a is a numerical value that satisfies $0 \leq a \leq 0.2$, b is a numerical value that satisfies $0 \leq b \leq 0.2$, and a+b is a numerical value that satisfies $0 < a+b \leq 0.4$).

In the general formula (3), a is usually $0 \leq a \leq 0.2$, preferably $0.001 \leq a \leq 0.05$, more preferably $0.005 \leq a \leq 0.03$. b is usually $0 \leq b \leq 0.2$, preferably $0.001 \leq b \leq 0.15$, more preferably $0.005 \leq b \leq 0.1$. a+b is usually $0 < a+b \leq 0.4$, preferably $0.002 \leq a+b \leq 0.2$, more preferably $0.01 \leq a+b \leq 0.13$. If a, b and a+b in the general formula (3) remain within the above ranges, then the obtained phosphor is easy to become such a phosphor, in which the light emission peak wavelength is relatively much longer than that of $Y_3Al_2(AlO_4)_3$:$Ce^{3+}$, and the temperature quenching is further improved in comparison with the other garnet phosphors which emit the same light color.

In the general formula (3), x is usually 0<x<1, preferably $0.1 \leq x \leq 0.9$, more preferably $0.5 \leq x \leq 0.9$. If x in the general formula (3) remains within the above range, then the obtained phosphor is easy to become such a phosphor, in which the light emission peak wavelength is relatively much longer than that of $Y_3Al_2(AlO_4)_3$:$Ce^{3+}$, and the temperature quenching is further improved in comparison with the other garnet phosphors which emit the same light color.

Specific examples of the phosphor represented by the general formula (3) are $0.1(Lu_{0.97}Ce_{0.03})_2CaMg_2Si_3O_{12} \cdot 0.9(Y_{0.98}Ce_{0.02})_3Al_5O_{12}$, $0.5(Lu_{0.97}Ce_{0.03})_2CaMg_2Si_3O_{12} \cdot 0.5(Y_{0.98}Ce_{0.02})_3Al_5O_{12}$, $0.9(Lu_{0.97}Ce_{0.03})_2CaMg_2Si_3O_{12} \cdot 0.1(Y_{0.98}Ce_{0.02})_3Al_5O_{12}$, and the like.

Moreover, a composition of the phosphor in which $Ce^{3+}$ is contained in the matrix garnet compound includes, for example, a compound represented by a general formula (4):

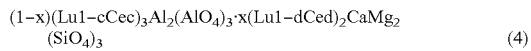

(4)

(where x is a numerical value that satisfies 0<x<1, c is a numerical value that satisfies 0≤c≤0.2, d is a numerical value that satisfies 0≤d≤0.2, and c+d is a numerical value that satisfies 0<c+d≤0.4).

In the general formula (3), c is usually 0≤c≤0.2, preferably 0.001≤c≤0.05, more preferably 0.005≤c≤0.03. d is usually 0≤d≤0.2, preferably 0.001≤d≤0.15, more preferably 0.005≤d≤0.1. c+d is usually 0≤c+d≤0.4, preferably 0.002≤c+d≤0.2, more preferably 0.01≤b≤0.13. If c, d and c+d in the general formula (3) remain within the above ranges, then the obtained phosphor is easy to become such a phosphor, in which the light emission peak wavelength is relatively much longer than that of $Lu_3Al_2(AlO_4)_3:Ce^{3+}$, and the temperature quenching is further improved in comparison with the other garnet phosphors which emit the same light color.

In the general formula (4), x is usually 0≤x≤1, preferably 0.1≤x≤0.9, more preferably 0.5≤x≤0.9. If x in the general formula (4) remains within the above range, then the obtained phosphor is easy to become such a phosphor, in which the light emission peak wavelength is relatively much longer than that of $Lu_3Al_2(AlO_4)_3:Ce^{3+}$, and the temperature quenching is further improved in comparison with the other garnet phosphors which emit the same light color.

Specific examples of the phosphor represented by the general formula (4) are $0.1(Lu_{0.97}Ce_{0.03})_2CaMg_2Si_3O_{12} \cdot 0.9(Lu_{0.98}Ce_{0.02})_3Al_5O_{12}$, $0.5(Lu_{0.97}Ce_{0.03})_2CaMg_2Si_3O_{12} \cdot 0.5(Lu_{0.98}Ce_{0.02})_3Al_5O_{12}$, $0.9(Lu_{0.97}Ce_{0.03})_2CaMg_2Si_3O_{12} \cdot 0.1(Lu_{0.98}Ce_{0.02})_3Al_5O_{12}$, and the like.

(Effects)

In accordance with the phosphor according to the embodiment, the novel garnet phosphor can be provided, in which the light emission peak wavelength is 560 nm or more, and the temperature quenching is improved in comparison with the other garnet phosphors which emit the same light color.

[Light Emitting Device]

Next, a description will be given of the light emitting device according to the embodiment with reference to FIGS. 1 to 3.

A light emitting device 114 according the embodiment uses the above phosphor. Specifically, the light emitting device 114 according to the embodiment uses the above phosphor, and includes a solid-state light emitting device 117 as an excitation source, and the phosphor is excited by light radiated by the solid-state light emitting device 117.

FIG. 1 is a diagram schematically showing a light emitting device according to a first embodiment. FIG. 2 is a diagram schematically showing a light emitting device according to a second embodiment. FIG. 3 is a diagram showing a light emitting device according to a third embodiment. The light emitting devices according to the first and second embodiments are roughly shown in FIGS. 1 and 2, and the light emitting device according to the third embodiment is shown in FIG. 3 in detail. The light emitting device 114 according to these embodiments is used for a semiconductor light emitting device, an illumination light source, an illumination device, a liquid crystal panel attached with an LED backlight, an LED projector, a laser projector and the like.

First Embodiment

As shown in FIG. 1, a light emitting device 114A according to the first embodiment includes: a phosphor 2; and an excitation source 117 that excites the phosphor 2. The light emitting device 114A shown as the first embodiment in FIG. 1 is a light emitting device having a structure in which a direction where the excitation source 117 irradiates the phosphor 2 with primary light 3 that is an excitation line or excitation light and a direction where the phosphor 2 radiates output light 113 are the same direction. The light emitting device 114A is preferably used for a white LED light source, a fluorescent lamp, an electron tube and the like.

The phosphor 2 is a phosphor containing the phosphor according to the above embodiment. The phosphor 2 may be composed of plural types of phosphors. The phosphor 2 contains at least the phosphor according to the above embodiment, and may contain the phosphor according to the above embodiment according to needs.

The phosphor 2 is usually molded into a plate shape, a film shape or the like to be then a wavelength conversion member. The wavelength conversion member is obtained, for example, by dispersing and fixing powder of the phosphor 2 into a transparent resin, by mutually adhering the phosphor 2 by an inorganic binding agent, and so on. Moreover, the wavelength conversion member is usually formed on a surface of a substrate or the like to be then a wavelength converter composed of the wavelength conversion member and the substrate. As the substrate to be used for the light emitting device 114A, a substrate having translucency is used. As the substrate having translucency, for example, a glass substrate, a translucent ceramic substrate and the like are used. As described above, the phosphor 2 in the light emitting device 114A is usually such a wavelength converter in which the wavelength conversion member containing the phosphor 2 is formed on the substrate having translucency.

The excitation source 117 is a light source that generates the primary light 3 for exciting the phosphor according to the above embodiment, which is contained in the phosphor 2. As the excitation source 117, for example, there is used a radiation device of a particle beam or an electromagnetic wave, which radiates a particle beam such as an α ray, a β ray and an electron beam, or an electromagnetic wave such as a γ ray, an X ray, a vacuum ultraviolet ray, an ultraviolet ray and visible light. Here, as the visible light, short wavelength visible light such as purple light and blue light is preferable. If the excitation source 117 radiates the short wavelength visible light such as purple light and blue light, then it is easy to increase an output of the light emitting device.

As the excitation source 117, specifically, there are used varieties of radiation generating devices, electron beam radiating devices, discharge light generating devices, solid-state light emitting elements, solid-state light emitting devices, and the like. A typical excitation source 117 includes an electron gun, an X-ray tube, a rare gas discharge device, a mercury discharge device, a light emitting diode, a laser beam generating device including a semiconductor laser, an inorganic or organic electroluminescence element, and the like.

As shown in FIG. 1, in the light emitting device 114A, the phosphor 2 excited by the primary light 3 that is the excitation line or the excitation light, which is radiated by the excitation source 117, radiates the output light 113. The output light 113 is radiated in the same direction as the primary light 3. The output light 113 radiated from the light emitting device 114A is used, for example, as illumination light and display light.

Second Embodiment

Figure 2:
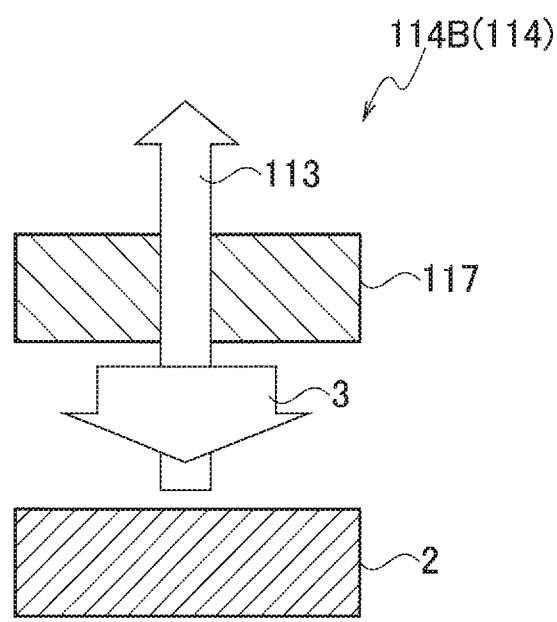
FIG. 2 is a diagram schematically showing a light emitting device according to a second embodiment.

As shown in FIG. 2, a light emitting device 114B according to the second embodiment includes: a phosphor 2; and an excitation source 117 that excites the phosphor 2. The light emitting device 114B shown as the second embodiment in FIG. 2 is a light emitting device having a structure in which the direction where the excitation source 117 irradiates the phosphor 2 with the primary light 3 that is an excitation line or excitation light and the direction where the phosphor 2 radiates output light 113 are opposite directions. That is, in comparison with the light emitting device 114A shown as the first embodiment in FIG. 1, the light emitting device 114B shown as the second embodiment in FIG. 2 is different therefrom in disposition of the excitation source 117 and the phosphor 2 and in direction of the output light 113 with respect to the primary light 3. The light emitting device 114B is preferably used for a plasma display device, a light source device and a projector, each of which uses a phosphor wheel attached with a reflection plate, and the like.

In comparison with the light emitting device 114A according to the first embodiment, the light emitting device 114B according to the second embodiment is similar thereto except for the fact that the excitation source 117 and the phosphor 2 are disposed differently therefrom. Note that, strictly speaking, a member of the light emitting device 114B, which contains the phosphor 2, and a member of the light emitting device 114A, which contains the phosphor 2, are different from each other in type of the substrate to which the phosphor 2 is fixed. However, the phosphor 2 itself is similar between the light emitting devices 114A and 114B. Therefore, between the light emitting device 114B shown as the second embodiment in FIG. 2 and the light emitting device 114A shown as the first embodiment in FIG. 1, the same reference numerals are assigned to the same members, and a description of configurations and functions thereof will be omitted or simplified.

As shown in FIG. 2, the light emitting device 114B according to the second embodiment includes: the phosphor 2; and the excitation source 117 that excites the phosphor 2. These phosphor 2 and excitation source 117 are similar to the phosphor 2 and the excitation source 117, which are used in the light emitting device 114A according to the first embodiment, and accordingly, the description of the members thereof will be omitted.

In a similar way to the light emitting device 114A shown as the first embodiment in FIG. 1, the phosphor 2 is usually molded into a plate shape, a film shape or the like to be then a wavelength conversion member. This wavelength conversion member is similar to that of the light emitting device 114A according to the first embodiment, and accordingly, a description thereof will be omitted. Moreover, the wavelength conversion member is usually formed on a surface of such a substrate or the like to be then a wavelength converter composed of the wavelength conversion member and the substrate. Unlike the light emitting device 114A according to the first embodiment, a substrate that does not have translucency is used as the substrate to be used for the light emitting device 114B. As the substrate that does not have translucency, for example, a metal substrate, a non-translucent ceramic substrate and the like are used. As described above, the phosphor 2 in the light emitting device 114B is usually such a wavelength converter in which the wavelength conversion member containing the phosphor 2 is formed on the substrate that does not have translucency.

The excitation source 117 is similar to that of the light emitting device 114A shown as the first embodiment in FIG. 1, and accordingly, a description thereof will be omitted.

As shown in FIG. 2, in the light emitting device 114B, the phosphor 2 excited by the primary light 3 that is the excitation line or the excitation light, which is radiated by the excitation source 117, radiates the output light 113. The output light 113 is radiated in the opposite direction to the primary light 3. The output light 113 radiated from the light emitting device 114B is used, for example, as illumination light and display light.

Third Embodiment

Figure 3:
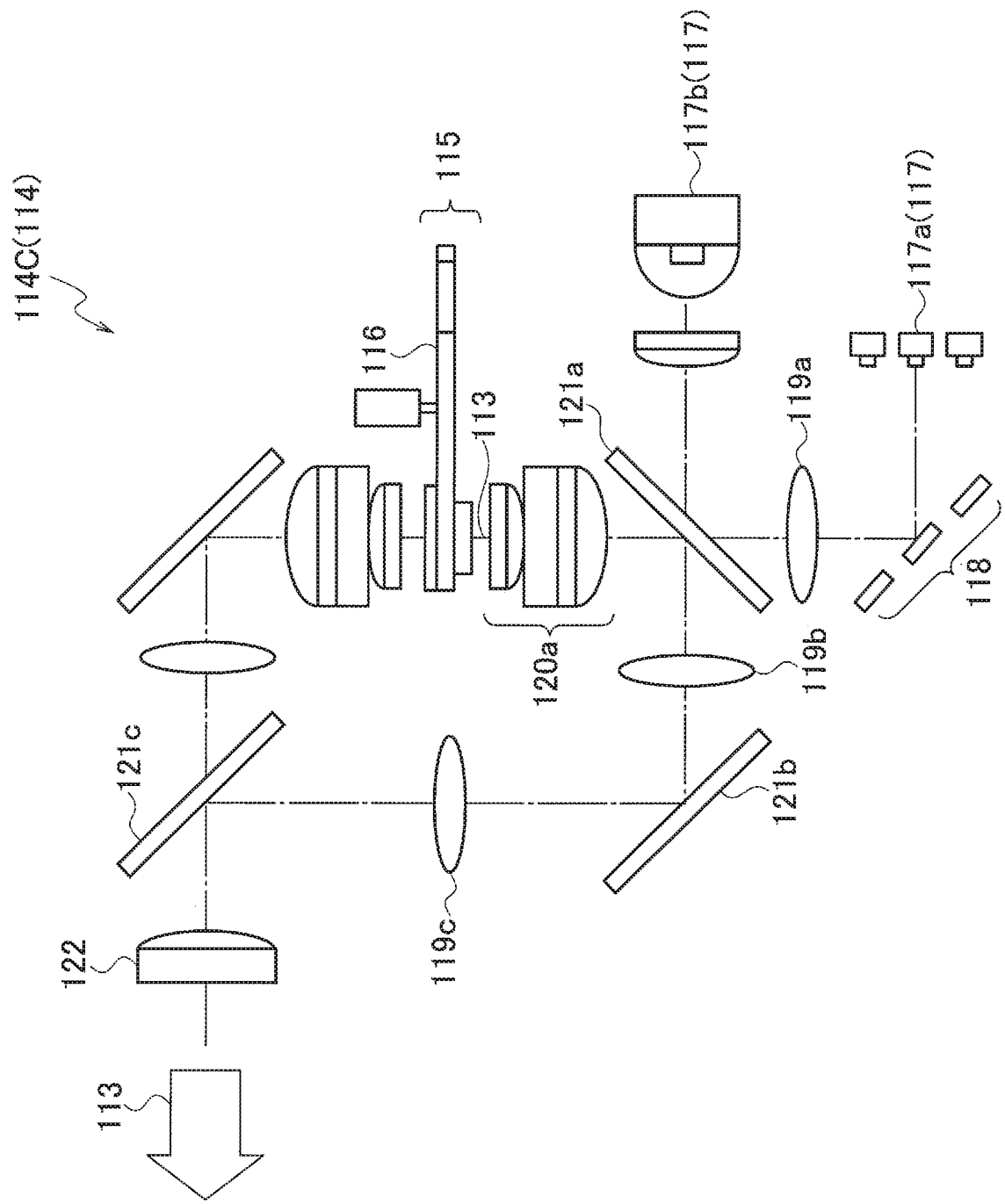
FIG. 3 is a diagram showing a light emitting device according to a third embodiment.

A light emitting device 114C shown as the third embodiment in FIG. 3 includes: a fluorescent screen 115 as a wavelength converter including the phosphor according to the above embodiment and a substrate 116; and the excitation source 117 that excites the phosphor in the fluorescent screen 115. The light emitting device 114C is an example of a light source for the projector.

The light emitting device 114C shown as the third embodiment in FIG. 3 and the light emitting device 114A shown as the first embodiment in FIG. 3 coincide with each other in terms of using the phosphor according to the above embodiment and including the excitation source 117. Therefore, in FIG. 3 showing the light emitting device 114C according to the third embodiment, the same reference numerals are assigned to the same constituents as those in FIG. 1 showing the light emitting device 114A according to the first embodiment, and a description of configurations and functions thereof will be omitted or simplified.

In the light emitting device 114C according to the third embodiment, the phosphor according to the above embodiment is the fluorescent screen 115 as the wavelength converter including the phosphor and the substrate 116. This fluorescent screen 115 is a member containing the phosphor according to the above embodiment, and accordingly, is a member in which the phosphor 2 in the light emitting devices 114A and 114B according to the first and second embodiments is embodied. Hereinafter, a more specific description will be given of the light emitting device 114C according to the third embodiment.

The light emitting device 114C according to the third embodiment includes: the fluorescent screen 115 as the wavelength converter including the phosphor according to the above embodiment and the substrate 116; and a first light source 117a as the excitation source 117 that excites the phosphor 2 contained in the fluorescent screen 115.

As the first light source 117a that is the excitation source 117, for example, there is used a solid-state light emitting device that emits purple or blue light having a light emission peak in a wavelength region of 400 nm or more and less than 480 nm. As such a solid-state light emitting device, for example, a blue LD is used. In the light emitting device 114C, at least the purple or blue light 113 radiated by the first light source 117a is directly or indirectly applied to the phosphor formed on the fluorescent screen 115.

Plural pieces of the first light source 117a are provided. The purple or blue light radiated by the first light source 117a is reflected by a reflection mirror 118, is condensed by a first lens 119a, and thereafter, is applied to the phosphor in the fluorescent screen 115.

A blue green or green light component 113 radiated by the phosphor, the light component 113 having been reflected by a reflection surface of the fluorescent screen 115, is condensed by a first condenser lens 120a. The light component 113 is thereafter subjected to repetition of optical axis conversion and condensing by a first optical axis conversion mirror 121a, a second lens 119b, a second optical axis conversion mirror 121b, a third lens 119c and a third optical axis conversion mirror 121c. The light component 113 subjected to the repetition of the optical axis conversion and the condensing is made incident onto an exit lens 122, and thereafter, is emitted from the light emitting device 114C.

Note that the light emitting device 114C can also be made as a light emitting device 114 for multicolor display. In this case, for example, a second light source 117b is further used, which radiates a light component of a color different from that of the first light source 117a as the excitation source 117.

(Effects)

In accordance with the light emitting device according to the embodiment, the light emitting device can be provided, in which the light emission peak wavelength is relatively long, and the temperature quenching is improved.

EXAMPLES

Hereinafter, the embodiment will be described more in detail by examples and comparative examples; however, the embodiment is not limited to these examples and comparative examples.

Phosphors according to the examples and the comparative examples were synthesized using a synthesis method that utilizes a solid phase reaction, and properties thereof were evaluated. Note that, in these examples and comparative example, the following compound powders were used as raw materials.

Yttrium oxide ($Y_2O_3$): purity 3N, made by Shin-Etsu Chemical Co., Ltd.

Lutetium oxide ($Lu_2O_3$): purity 3N, made by Shin-Etsu Chemical Co., Ltd.

Gadolinium oxide ($Gd_2O_3$): purity 3N, made by Kanto Chemical Co., Inc.

Calcium carbonate ($CaCO_3$): purity 2N5, made by Kanto Chemical Co., Inc.

Magnesium oxide (MgO): purity 4N, made by Kojundo Chemical Laboratory Co., Ltd.

Cerium oxide ($CeO_2$): purity 4N, made by Shin-Etsu Chemical Co., Ltd.

Aluminum oxide ($\theta$—$Al_2O_3$): purity 4N5, AKP-G008 made by Sumitomo Chemical Co., Ltd.

Silicon dioxide ($SiO_2$): purity>3N, AEROSIL 200 made by Nippon Aerosil Co., Ltd.

Moreover, in the comparative example, the following compound powders were used as reaction accelerators.

Aluminum fluoride ($AlF_3$): purity 3N, made by Kojundo Chemical Laboratory Co., Ltd.

Potassium carbonate ($K_2CO_3$): purity 2N5, made by Kanto Chemical Co., Inc.

Note that optimum values of a synthesis temperature differ for each compound, and accordingly, an optimized synthesis temperature is selected in each of the compounds.

Example 1

First, the respective raw materials were weighed at a ratio shown in Table 1. Next, these raw materials were put into a glass beaker together with an appropriate amount of pure water, and were stirred sufficiently using a magnetic stirrer, and a mixed raw material in a slurry form was obtained. Then, the mixed raw material in the slurry form was transferred to a container, and was dried at 150° C. for 3 hours using a dryer. The mixed raw material already dried was pulverized using a mortar and a pestle, whereby a baked raw material was obtained.

TABLE 1

| | Blending amount (g) | | | | | | | | | |
|---|---|---|---|---|---|---|---|---|---|---|
| | Raw material of phosphor | | | | | | | | Reaction accelerator | |
| | $Y_2O_3$ | $Lu_2O_3$ | $Gd_2O_3$ | $CeO_2$ | $CaCO_3$ | MgO | $Al_2O_3$ | $SiO_2$ | $AlF_3$ | $K_2CO_3$ |
| Example 1 | 1.2022 | 0.1544 | 0 | 0.0413 | 0.0400 | 0.0322 | 0.9623 | 0.0739 | 0 | 0 |
| Example 2 | 0.6679 | 0.7720 | 0 | 0.0413 | 0.2002 | 0.1612 | 0.5346 | 0.3693 | 0 | 0 |
| Example 3 | 0.1336 | 1.3896 | 0 | 0.0413 | 0.3603 | 0.2902 | 0.1069 | 0.6647 | 0 | 0 |
| Comparative example 1 | 0.8349 | 0 | 0 | 0.0258 | 0 | 0 | 0.6683 | 0 | 0.0063 | 0.0035 |
| Comparative example 2 | 0 | 1.4624 | 0 | 0.0258 | 0 | 0 | 0.6683 | 0 | 0.0063 | 0.0035 |
| Comparative example 3 | 0.6474 | 0 | 1.6422 | 0.0516 | 0 | 0 | 1.3365 | 0 | 0.0063 | 0.0035 |
| Comparative example 4 | 1.6697 | 0 | 0 | 0.0516 | 0 | 0.2016 | 0.8019 | 0.3077 | 0.0063 | 0.0035 |
| Comparative example 5 | 0 | 0.7720 | 0 | 0.0206 | 0.2002 | 0.1612 | 0 | 0.3692 | 0 | 0 |
| Example 4 | 0 | 2.2603 | 0 | 0.0413 | 0.0400 | 0.0322 | 0.9623 | 0.0739 | 0 | 0 |
| Example 5 | 0 | 1.9419 | 0 | 0.0413 | 0.2002 | 0.1612 | 0.5346 | 0.3693 | 0 | 0 |
| Example 6 | 0 | 1.6236 | 0 | 0.0413 | 0.3603 | 0.2902 | 0.1069 | 0.6647 | 0 | 0 |
| Example 7 | 0 | 2.8254 | 0 | 0.0517 | 0.0451 | 0.0424 | 1.2029 | 0.0923 | 0 | 0 |
| Example 8 | 0 | 2.4275 | 0 | 0.0517 | 0.2252 | 0.2117 | 0.6683 | 0.4616 | 0 | 0 |
| Example 9 | 0 | 2.0295 | 0 | 0.0517 | 0.4054 | 0.3810 | 0.1337 | 0.8308 | 0 | 0 |
| Example 10 | 0 | 1.9300 | 0 | 0.0517 | 0.4504 | 0.4233 | 0 | 0.9232 | 0 | 0 |

Thereafter, the baked raw material was transferred to an alumina crucible attached with a cover, and was subjected to main baking for 2 hours in an atmosphere of 1400° C. using a box type electric furnace.

A baked product obtained as a result of the main baking was lightly disintegrated one more time using the mortar and the pestle, and an object to be subjected to reduction treatment was obtained. The object to be subjected to the reduction treatment was transferred to the alumina crucible, and was subjected to the reduction treatment for 1 hour in a reducing gas atmosphere of 1350 to 1500° C. using a tubular atmosphere furnace. Note that, as a reducing gas for forming the reducing gas atmosphere, a mixed gas of nitrogen and hydrogen at a volume ratio of 96% by volume of $N_2$ and 4% by volume of $H_2$ was used, and a flow rate of the reducing gas was set to 100 cc/min. After the reduction treatment, $0.1(Lu_{0.97}Ce_{0.03})_2CaMg_2Si_3O_{12}\cdot 0.9(Y_{0.98}Ce_{0.02})_3Al_5O_{12}$ was obtained.

Example 2

$0.5(Lu_{0.97}Ce_{0.03})_2CaMg_2Si_3O_{12}\cdot 0.5(Y_{0.98}Ce_{0.02})_3Al_5O_{12}$ was obtained in a similar way to Example 1 except that a blending ratio of the respective raw materials was changed to that in Table 1.

Example 3

$0.9(Lu_{0.97}Ce_{0.03})_2CaMg_2Si_3O_{12}\cdot 0.1(Y_{0.98}Ce_{0.02})_3Al_5O_{12}$ was obtained in a similar way to Example 1 except that the blending ratio of the respective raw materials was changed to that in Table 1.

Comparative Example 1

First, the respective raw materials and a reaction accelerator were weighed at a ratio shown in Table 1. Next, these raw materials were put into a glass beaker together with an appropriate amount of pure water, and were stirred sufficiently using a magnetic stirrer, and a mixed raw material in a slurry form was obtained. Then, the mixed raw material in the slurry form was transferred to a container, and was dried at 150° C. for 3 hours using a dryer. The mixed raw material already dried was pulverized using a mortar and a pestle, whereby a baked raw material was obtained.

Thereafter, the baked raw material was transferred to the alumina crucible, and was baked for 2 hours in a reducing gas atmosphere of 1500° C. using the tubular atmosphere furnace. Note that, as such a reducing gas for forming the reducing gas atmosphere, a mixed gas of nitrogen and hydrogen at a volume ratio of 96% by volume of $N_2$ and 4% by volume of $H_2$ was used, and a flow rate of the reducing gas was set to 100 cc/min. After the reduction treatment, $(Y_{0.98}Ce_{0.02})_3Al_2(AlO_4)_3$ as the $Y_3Al_2(AlO_4)_3:Ce^{3+}$ phosphor was obtained.

Comparative Example 2

$(Lu_{0.98}Ce_{0.02})_3Al_2(AlO_4)_3$ that was the known $Lu_3Al_2(AlO_4)_3:Ce^{3+}$ phosphor was obtained in a similar way to Comparative example 1 except that a blending ratio of the respective raw materials and the reaction accelerator was changed to that in Table 1.

Comparative Example 3

$(Y_{0.38}Gd_{0.6}Ce_{0.02})_3Al_2(AlO_4)_3$ that was the known $(Y,Gd)_3Al_2(AlO_4)_3:Ce^{3+}$ phosphor was obtained in a similar way to Comparative example 1 except that the blending ratio of the respective raw materials and the reaction accelerator was changed to that in Table 1.

Comparative Example 4

$(Y_{0.98}Ce_{0.02})_3AlMg(AlO_4)_2(SiO_4):Ce^{3+}$ that was the known $Y_3(Al,Mg)_2((Al,Si)O_4)_3:Ce^{3+}$ phosphor was obtained in a similar way to Comparative example 1 except that the blending ratio of the respective raw materials and the reaction accelerator was changed to that in Table 1.

Comparative Example 5

First, the respective raw materials were weighed at a ratio shown in Table 1. Next, these raw materials were put into a glass beaker together with an appropriate amount of pure water, and were stirred sufficiently using a magnetic stirrer, and a mixed raw material in a slurry form was obtained. Then, the mixed raw material in the slurry form was transferred to a container, and was dried at 150° C. for 3 hours using a dryer. The mixed raw material already dried was pulverized using a mortar and a pestle, whereby a baked raw material was obtained.

Thereafter, the baked raw material was transferred to an alumina crucible attached with a cover, and was subjected to main baking for 2 hours in an atmosphere of 1400° C. using a box type electric furnace.

A baked product obtained as a result of the main baking was lightly disintegrated one more time using the mortar and the pestle, and an object to be subjected to reduction treatment was obtained. This object to be subjected to the reduction treatment was transferred to the alumina crucible, and was subjected to the reduction treatment for 1 hour in a reducing gas atmosphere of 1350° C. using a tubular atmosphere furnace. Note that, as such a reducing gas for forming the reducing gas atmosphere, a mixed gas of nitrogen and hydrogen at a volume ratio of 96% by volume of $N_2$ and 4% by volume of $H_2$ was used, and a flow rate of the reducing gas was set to 100 cc/min. After the reduction treatment, $(Lu_{0.97}Ce_{0.03})_2CaMg_2(SiO_4)_3:Ce^{3+}$ that was the known $Lu_2CaMg_2(SiO_4)_3:Ce^{3+}$ phosphor was obtained.

Evaluation of Examples 1 to 3 and Comparative Examples 1 to 5

<Crystal Structure Analysis>

Figure 4:
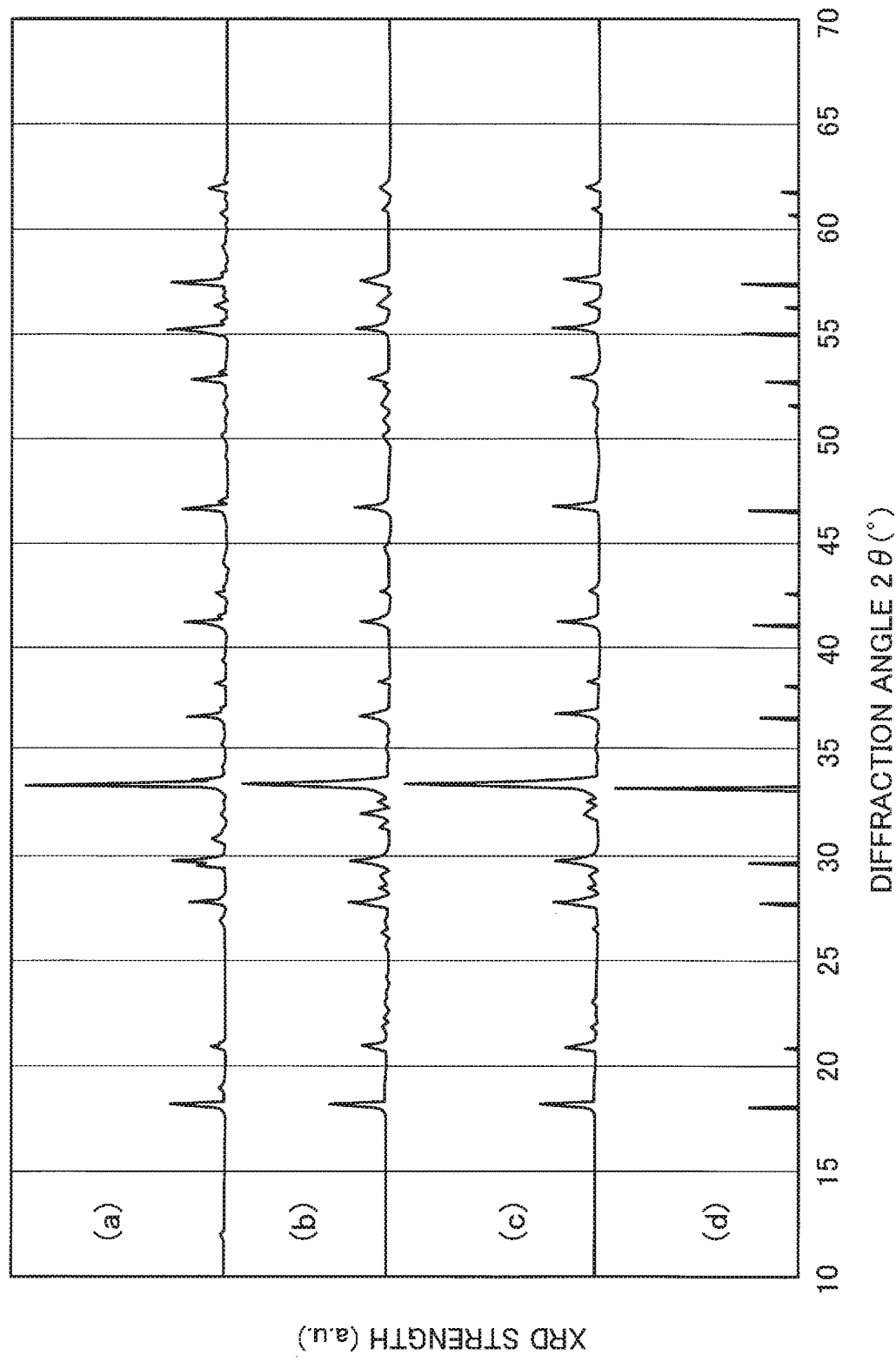
FIG. 4 is a graph showing XRD patterns of compounds of Examples 1 to 3 and a known compound.

First, crystal structure analysis for the compounds of Examples 1 to 3 was carried out. FIG. 4 is a graph showing X-ray diffraction (XRD) patterns of the compounds of Examples 1 to 3 and a known compound. Note that the XRD patterns were evaluated using an X-ray diffraction device (product name: MultiFlex, made by Rigaku Corporation).

In FIG. 4, the XRD pattern of Example 1 is shown as (a), the XRD pattern of Example 2 is shown as (b), and the XRD pattern of Example 3 is shown as (c). Moreover, as a reference, the pattern (PDF No. 33-0040) of $Al_5Y_3O_{12}$, which is registered in the PDF (Power Diffraction Files), is shown as (d).

When the respective patterns shown in FIG. 4 were compared with one another, the following facts were found. That is, it was found that the XRD patterns of Examples 1 to 3 substantially coincided with the pattern of $Al_5Y_3O_{12}$, which is shown by (d), in terms of shape features.

Such coincidence of the XRD patterns indicates that the compounds of Examples 1 to 3 are mainly composed of compounds having the same garnet structure as that of $Al_5Y_3O_{12}$. Then, in consideration of a weight ratio, it can be said that the compound of Example 1 is a solid solution of the compound $(Lu_{0.97}Ce_{0.03})_2CaMg_2Si_3O_{12}$ and the compound $(Y_{0.98}Ce_{0.02})_3Al_{15}O_{12}$. It can be said that a specific composition of the compound of Example 1 is $0.1(Lu_{0.97}Ce_{0.03})_2CaMg_2Si_3O_{12} \cdot 0.9(Y_{0.98}Ce_{0.02})_3Al_5O_{12}$.

Moreover, it can be said that the compound of Example 2 is a solid solution of the compound $(Lu_{0.97}Ce_{0.03})_2CaMg_2Si_3O_{12}$ and the compound $(Y_{0.98}Ce_{0.02})_3Al_5O_{12}$. It can be said that a specific composition of the compound of Example 2 is $0.5(Lu_{0.97}Ce_{0.03})_2CaMg_2Si_3O_{12} \cdot 0.5(Y_{0.98}Ce_{0.02})_3Al_5O_{12}$.

Moreover, it can be said that the compound of Example 3 is a solid solution of the compound $(Lu_{0.97}Ce_{0.03})_2CaMg_2Si_3O_{12}$ and the compound $(Y_{0.98}Ce_{0.02})_3Al_5O_{12}$. It can be said that a specific composition of the compound of Example 3 is $0.9(Lu_{0.97}Ce_{0.03})_2CaMg_2Si_3O_{12} \cdot 0.1(Y_{0.98}Ce_{0.02})_3Al_5O_{12}$.

Figure 5:
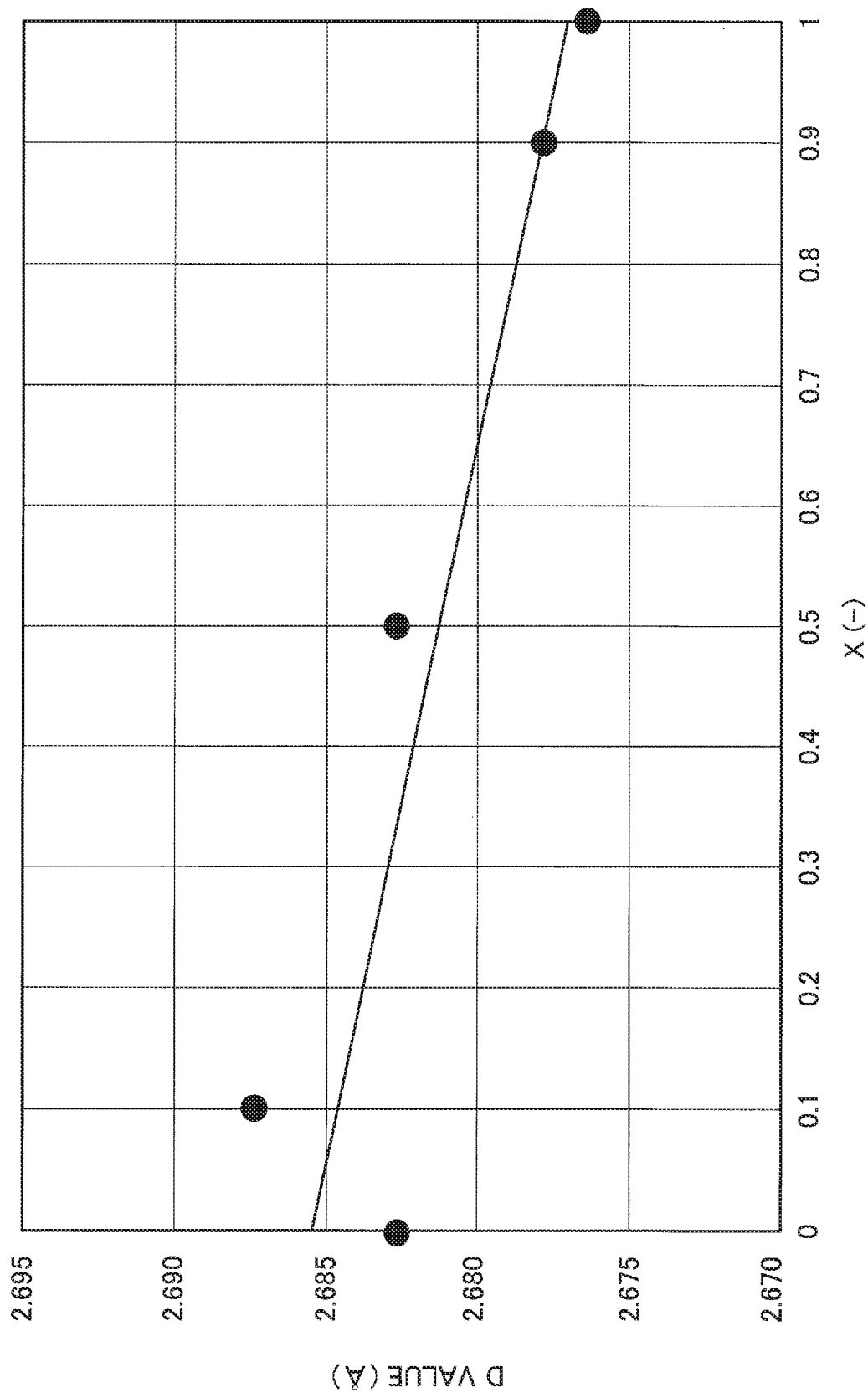
FIG. 5 is a graph showing relationships between d values of (420) planes and solid solution amounts x in compounds of Examples 1 to 3 and Comparative examples 1 and 5.

FIG. 5 is a graph showing relationships between d values of (420) planes and solid solution amounts x in the compounds of Examples 1 to 3 and Comparative examples 1 and 5. Specifically, FIG. 5 is a graph showing relationships between x and the d values when the above compound is represented as a solid solution represented by $(1-x)(Y_{0.98}Ce_{0.02})_3Al_2(AlO_4)_3 \cdot x(Lu_{0.97}Ce_{0.03})_2CaMg_2(SiO_4)_3$. The d values of the (420) planes are intervals of the adjacent (420) planes.

The graph of FIG. 5 was created as follows. First, the d value of the (420) planes of each of the compounds was calculated based on an XRD diffraction angle (2θ) of a main peak (a diffraction line of each of the (420) planes) near 33° of the XRD pattern of the compound. Next, such a graph showing the relationships between x and the d values was created based on the d values of the respective compounds and the compositions of the respective compounds, which are represented by $(1-x)(Y_{0.98}Ce_{0.02})_3Al_2(AlO_4)_3 \cdot x(Lu_{0.97}Ce_{0.03})_2CaMg_2(SiO_4)_3$.

Note that the XRD patterns of the compounds of Comparative example 1 and Comparative example 5 were measured by using an X-ray diffraction device similar to that for Examples 1 to 3.

As shown in FIG. 5, it was found that the d value decreased substantially in proportion to x. That is, as seen from FIG. 5, as x was increased, an interplanar spacing of the (420) planes of the phosphor continuously decreased.

The d value decreases substantially in proportion to x as described above, and accordingly, it can be said that FIG. 4 and FIG. 5 show data indicating that the compound $(Lu_{0.97}Ce_{0.03})_2CaMg_2Si_3O_{12}$ and the compound $(Y_{0.98}Ce_{0.02})_3Al_5O_{12}$ form the solid solution.

Moreover, analysis results shown in FIG. 4 and FIG. 5 indicate the presence of the phosphor and a synthesis fact of the phosphor, the phosphor containing at least $Ce^{3+}$ as a light emission center, and including, as a matrix, the solid solution of the end member $Y_3Al_2(AlO_4)_3$ and the end member $Lu_2CaMg_2(SiO_4)_3$. Here, the solid solution of the end member $Y_3Al_2(AlO_4)_3$ and the end member $Lu_2CaMg_2(SiO_4)_3$ is specifically a compound represented by $(1-x)Y_3Al_2(AlO_4)_3 \cdot xLu_2CaMg_2(SiO_4)_3$.

Note that such a solid solution as above has never been known before, and moreover, cannot be conceived based on the prior art. The solid solution as above can be confirmed for the first time through experimental verification.

<Ultraviolet Ray Irradiation Test>

An ultraviolet ray irradiation test of irradiating the compounds of Examples 1 to 3 with an ultraviolet ray (wavelength: 365 nm) was carried out.

When the compound of Example 1 was irradiated with the ultraviolet ray (wavelength: 365 nm), yellow green fluorescence was visually observed. That is, the compound of Example 1 was a phosphor that radiated the yellow green light.

When the compound of Example 2 was irradiated with the ultraviolet ray (wavelength: 365 nm), yellow fluorescence was visually observed. That is, the compound of Example 2 was a phosphor that radiated the yellow light.

When the compound of Example 3 was irradiated with the ultraviolet ray (wavelength: 365 nm), orange fluorescence was visually observed. That is, the compound of Example 3 was a phosphor that radiated the orange light.

<Measurement of Excitation Characteristics and Light Emission Characteristics>

Excitation characteristics and light emission characteristics of the compounds of Examples 1 to 3 were measured. The excitation characteristics and the light emission characteristics were measured using a spectrofluoro-photometer (FP-6500 made by JASCO Corporation).

Figure 6:
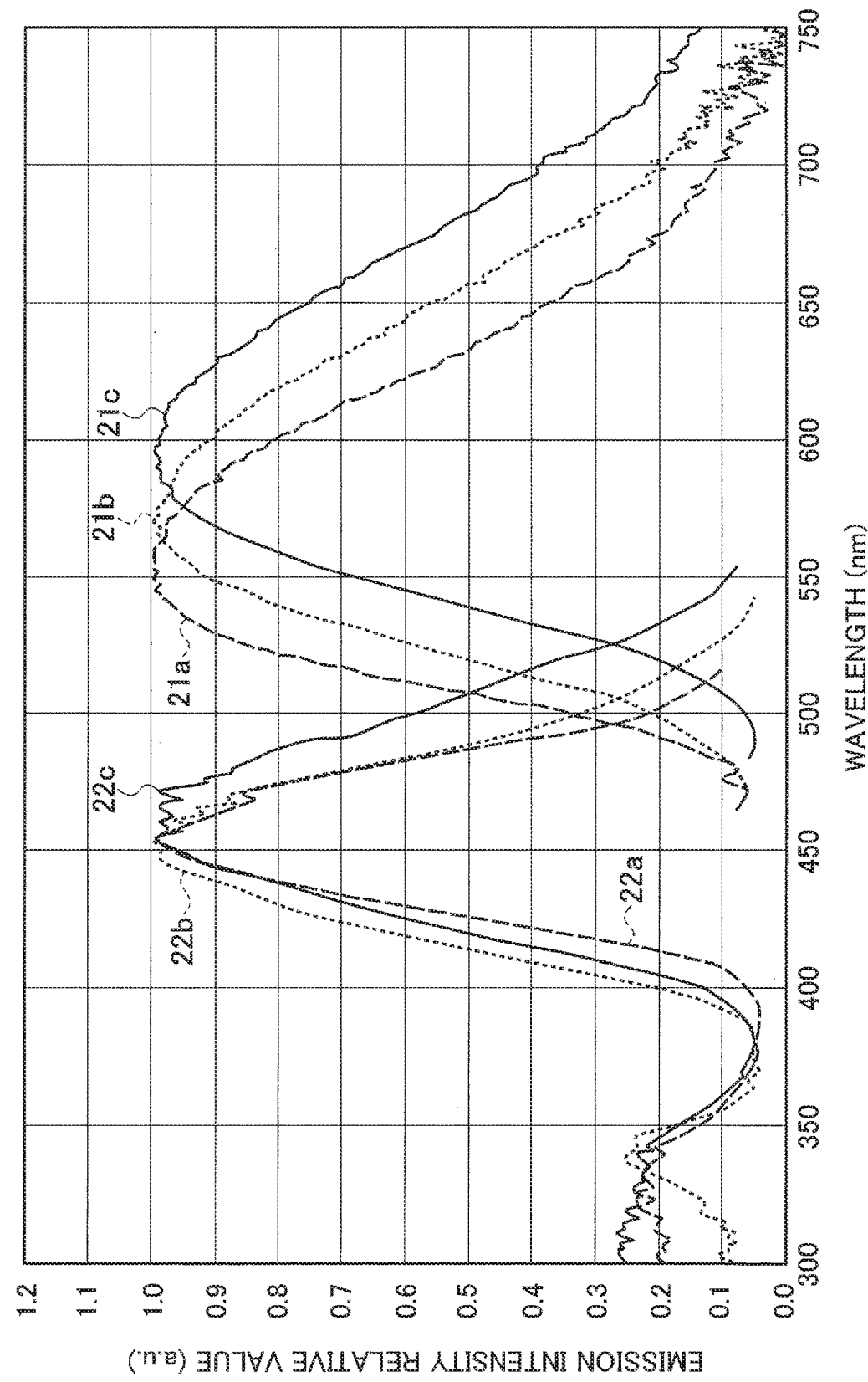
FIG. 6 is a graph showing excitation spectra and light emission spectra of the compounds of Examples 1 to 3.

FIG. 6 is a graph showing excitation spectra and light emission spectra of the compounds of Examples 1 to 3. Specifically, in FIG. 6, the light emission spectrum of the compound $0.1(Lu_{0.97}Ce_{0.03})_2CaMg_2Si_3O_{12} \cdot 0.9(Y_{0.98}Ce_{0.02})_3Al_5O_{12}$ in Example 1 is shown as 21a, and an light emission spectrum thereof is shown as 22a. Moreover, in FIG. 6, the light emission spectrum of the compound $0.5(Lu_{0.97}Ce_{0.03})_2CaMg_2Si_3O_{12} \cdot 0.5(Y_{0.98}Ce_{0.02})_3Al_5O_{12}$ in Example 2 is shown as 21b, and an light emission spectrum thereof is shown as 22b. Furthermore, in FIG. 6, the light emission spectrum of the compound $0.9(Lu_{0.97}Ce_{0.03})_2CaMg_2Si_3O_{12} \cdot 0.1(Y_{0.98}Ce_{0.02})_3Al_5O_{12}$ in Example 3 is shown as 21c, and an light emission spectrum thereof is shown as 22c.

Note that an excitation wavelength at measurement of the light emission spectrum was defined as the excitation peak wavelength, and a monitor wavelength at measurement of the excitation spectrum was defined as the light emission peak wavelength. Moreover, both of the light emission spectra and the excitation spectra in FIG. 6 are standardized and shown while taking peak values thereof as 1.

As seen from FIG. 6, the excitation spectra of the phosphors in Examples 1 to 3 had maximum values of excitation intensities in the wavelength region of the blue color. Specifically, all of the excitation spectra of the phosphors in Examples 1 to 3 had the maximum values of the excitation intensities at 453 nm. From these results, it was found that the phosphors of Examples 1 to 3 emit light strongly when irradiated with blue light.

Moreover, as seen from FIG. 6, the light emission spectra of the phosphors in Examples 1 to 3 contain a spectrum component derived from electron energy transition of $Ce^{3+}$. This is because the light emission spectra of the phosphors in Examples 1 to 3 take a shape mainly composed of the light emission spectra derived from the electron energy transition of $Ce^{3+}$.

Then, as seen from FIG. 6, the light emission spectra of the phosphors in Examples 1 to 3 had the light emission peaks at 554 nm, 570 nm and 597 nm, respectively. From these results, it was found that the phosphors in Examples 1 to 3 were such phosphors having relatively longer light emission peak wavelengths than the $Y_3Al_2(AlO_4)_3$:$Ce^{3+}$ phosphor.

As seen from FIGS. 4 to 6, with regard to the phosphors represented by $(1-x)(Y_{0.98}Ce_{0.02})_3Al_2(AlO_4)_3 \cdot x(Lu_{0.07}Ce_{0.03})_2CaMg_2(SiO_4)_3$, the light emission peaks thereof can be controlled within a range of 554 nm or more and less than 597 nm. With regard to the phosphors represented by $(1-x)(Y_{0.08}Ce_{0.02})_3Al_2(AlO_4)_3 \cdot x(Lu_{0.97}Ce_{0.03})_2 CaMg_2(SiO_4)_3$, it is easy to control the light emission peaks thereof within a range of 560 nm or more and less than 590 nm, which is useful for enhancing lighting color rendering.

From the above results of Examples 1 to 3, it was found that the matrix garnet compound was a compound in which the end member $Y_3Al_2(AlO_4)_3$ is entirely solid-solved with the end member $Lu_2CaMg_2(SiO_4)_3$. Moreover, from the above results of Examples 1 to 3, it was found that the light emission peak wavelengths of the phosphors composed by containing $Ce^{3+}$ in the matrix garnet compound can be controlled within a range of 535 nm or more and less than 610 nm, and in particular, a range of 545 nm or more and less than 590 nm.

Examples 4 to 6

$0.1(Lu_{0.97}Ce_{0.03})_2CaMg_2Si_3O_{12} \cdot 0.9(Lu_{0.98}Ce_{0.02})_3 Al_5O_{12}$ was obtained in a similar way to Example 1 except that the blending ratio of the respective raw materials was changed to that in Table 1 (Example 4).

Moreover, $0.5(Lu_{0.97}Ce_{0.03})_2CaMg_2Si_3O_{12} \cdot 0.5 (Lu_{0.98}Ce_{0.02})_3Al_5O_{12}$ was obtained in a similar way to Example 1 except that the blending ratio of the respective raw materials was changed to that in Table 1 (Example 5).

Furthermore, $0.9(Lu_{0.97}Ce_{0.03})_2CaMg_2Si_3O_{12} \cdot 0.1 (Lu_{0.98}Ce_{0.02})_3Al_5O_{12}$ was obtained in a similar way to Example 1 except that the blending ratio of the respective raw materials was changed to that in Table 1 (Example 6).

Evaluation of Examples 4 to 6

For the compounds of Examples 4 to 6, crystal structure analysis, ultraviolet ray irradiation test and measurement of excitation characteristics and light emission characteristics were carried out in a similar way to Example 1.

<Crystal Structure Analysis>

Figure 7:
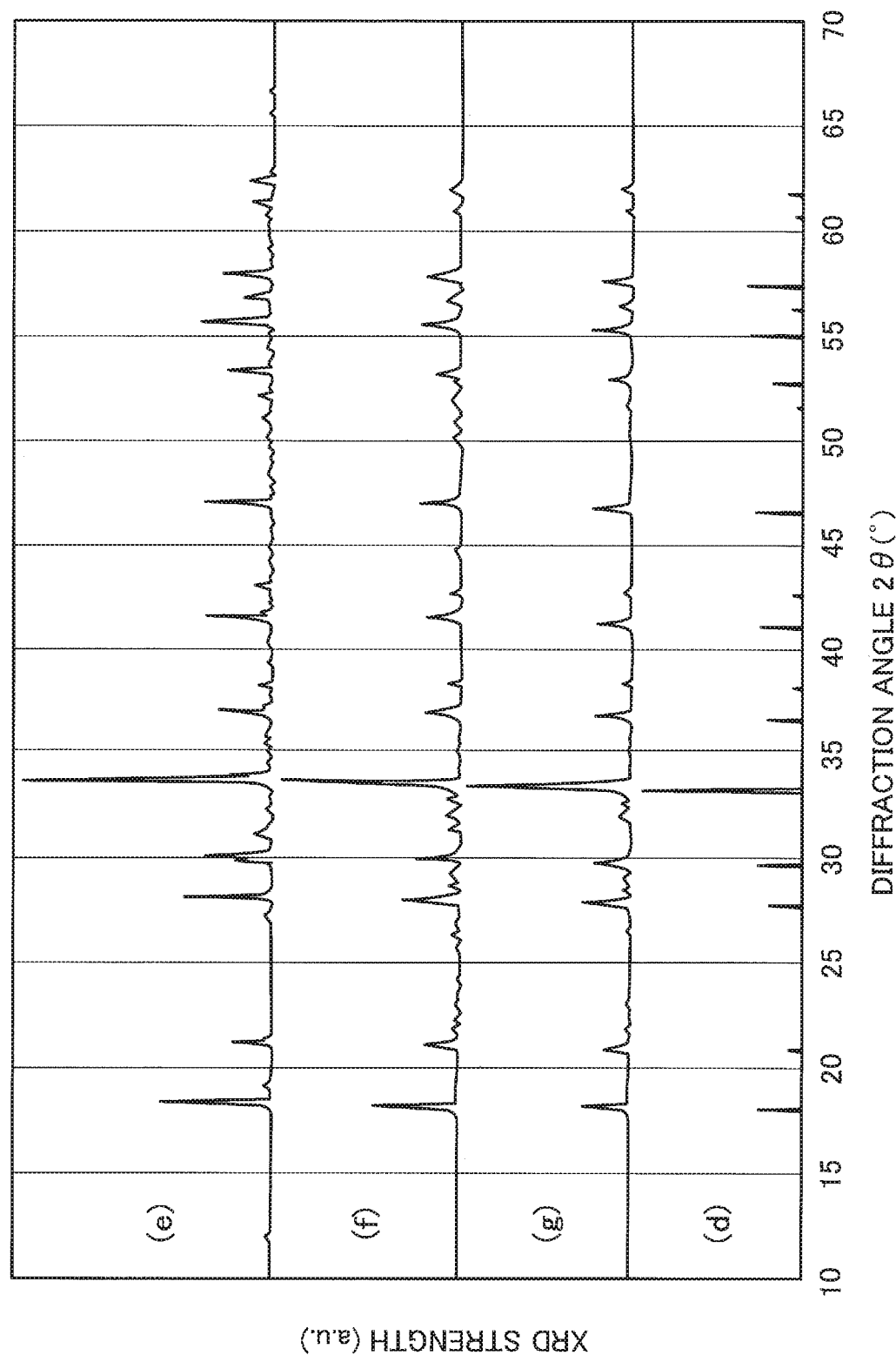
FIG. 7 is a graph showing XRD patterns of compounds of Examples 4 to 6 and the known compound.

FIG. 7 is a graph showing X-ray diffraction (XRD) patterns of the compounds of Examples 4 to 6 and a known compound.

In FIG. 7, the XRD pattern of Example 4 is shown as (e), the XRD pattern of Example 5 is shown as (f), and the XRD pattern of Example 6 is shown as (g). Moreover, as a reference, the pattern (PDF No. 33-0040) of $Al_5Y_3O_{12}$, which is registered in the PDF (Power Diffraction Files), is shown as (d).

When the respective patterns shown in FIG. 7 were compared with one another, the following facts were found. That is, it was found that the XRD patterns of Examples 4 to 6 substantially coincided with the pattern of $Al_5Y_3O_{12}$, which is shown by (d), in terms of shape features.

Such coincidence of the XRD patterns indicates that the compounds of Examples 4 to 6 are mainly composed of compounds having the same garnet structure as that of $Al_5Y_3O_{12}$. Then, in consideration of a weight ratio, it can be said that the compound of Example 4 is a solid solution of the compound $(Lu_{0.97}Ce_{0.03})_2CaMg_2Si_3O_{12}$ and the compound $(Lu_{0.98}Ce_{0.02})_3Al_5O_{12}$. It can be said that a specific composition of the compound of Example 4 is $0.1 (Lu_{0.97}Ce_{0.03})_2CaMg_2Si_3O_{12} \cdot 0.9(Lu_{0.98}Ce_{0.02})_3Al_5O_{12}$.

Moreover, it can be said that the compound of Example 5 is a solid solution of the compound $(Lu_{0.97}Ce_{0.03})_2 CaMg_2Si_3O_{12}$ and the compound $(Lu_{0.98}Ce_{0.02})_3Al_5O_{12}$. It can be said that a specific composition of the compound of Example 5 is $0.5(Lu_{0.07}Ce_{0.03})_2CaMg_2Si_3O_{12} \cdot 0.5 (Lu_{0.08}Ce_{0.02})_3Al_5O_{12}$.

Moreover, it can be said that the compound of Example 6 is a solid solution of the compound $(Lu_{0.97}Ce_{0.03})_2 CaMg_2Si_3O_{12}$ and the compound $(Lu_{0.98}Ce_{0.02})_3Al_5O_{12}$. It can be said that a specific composition of the compound of Example 6 is $0.9(Lu_{0.97}Ce_{0.03})_2CaMg_2Si_3O_{12} \cdot 0.1 (Lu_{0.98}Ce_{0.02})_3Al_5O_{12}$.

Figure 8:
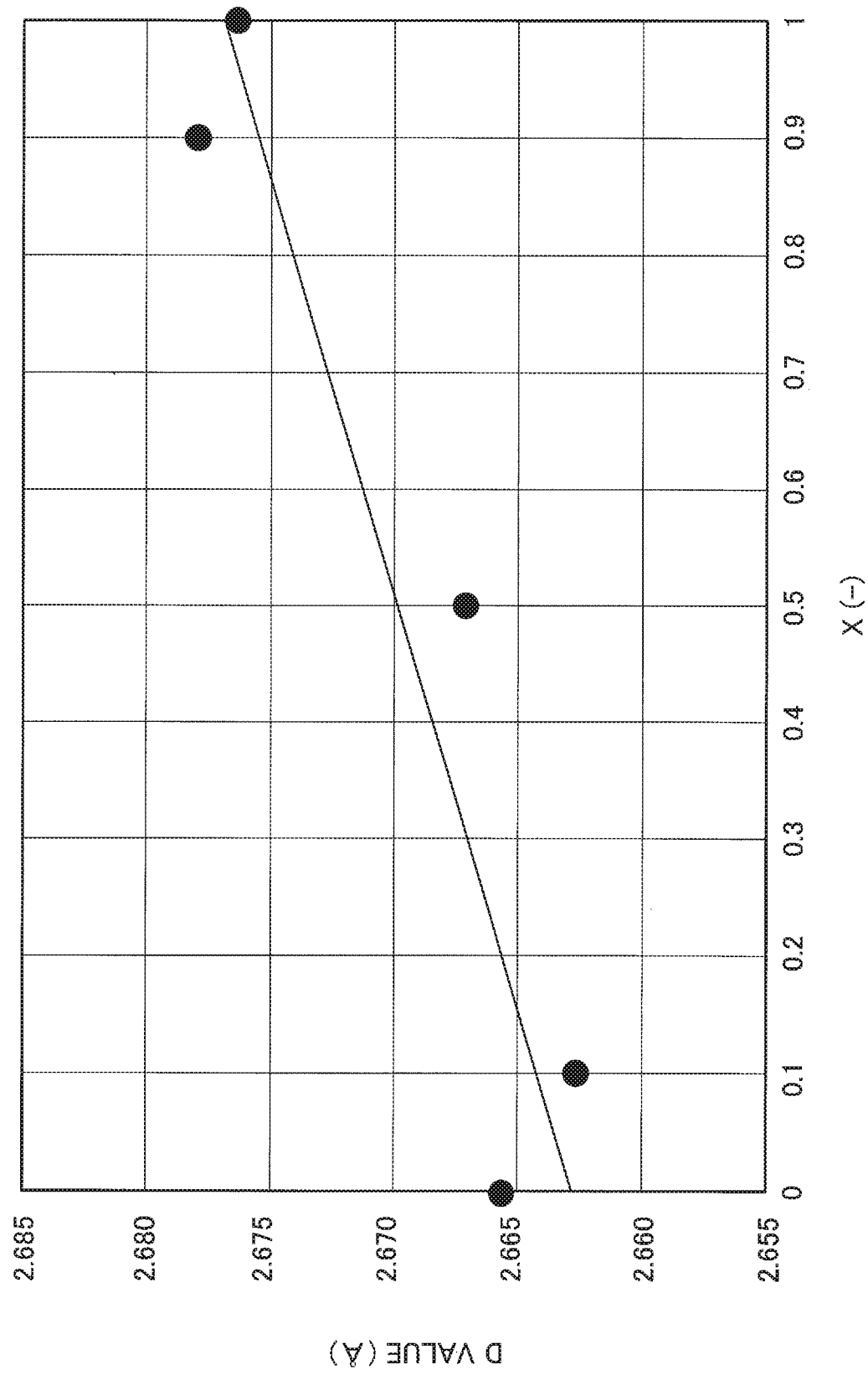
FIG. 8 is a graph showing relationships between d values of (420) planes and solid solution amounts x in compounds of Examples 4 to 6 and Comparative examples 2 and 5.

FIG. 8 is a graph showing relationships between d values of (420) planes and solid solution amounts x in the compounds of Examples 4 to 6 and Comparative examples 2 and 5. Specifically, FIG. 8 is a graph showing relationships between x and the d values when the above compound is represented as a solid solution represented by $(1-x) (Lu_{0.98}Ce_{0.02})_3Al_2(AlO_4)_3 \cdot x(Lu_{0.97}Ce_{0.03})_2CaMg_2(SiO_4)_3$. The d values of the (420) planes are intervals of the adjacent (420) planes.

The graph of FIG. 8 was created as follows. First, the d value of the (420) planes of each of the compounds was calculated based on an XRD diffraction angle (2θ) of a main peak (a diffraction line of each of the (420) planes) near 33° of the XRD pattern of the compound. Next, such a graph showing the relationships between x and the d values was created based on the d values of the respective compounds and the compositions of the respective compounds, which are represented by $(1-x)(Lu_{0.98}Ce_{0.02})_3Al_2(AlO_4)_3 \cdot (Lu_{0.97}Ce_{0.03})_2CaMg_2(SiO_4)_3$.

Note that the XRD patterns of the compounds of Comparative example 2 were measured by using an X-ray diffraction device similar to that for Examples 1 to 3.

As shown in FIG. 8, it was found that the d value increased substantially in proportion to x. That is, as seen from FIG. 8, as x was increased, such an interplanar spacing of the (420) planes of the phosphor continuously increased.

The d value increases substantially in proportion to x as described above, and accordingly, it can be said that FIG. 7 and FIG. 8 show data indicating that the compound $(Lu_{0.97}Ce_{0.03})_2CaMg_2Si_3O_{12}$ and the compound $(Lu_{0.98}Ce_{0.02})_3Al_5O_{12}$ form the solid solution.

Moreover, analysis results shown in FIG. 7 and FIG. 8 indicate the presence of the phosphor and a synthesis fact of the phosphor, the phosphor containing at least $Ce^{3+}$ as a light emission center, and including, as a matrix, the solid solution of the end member $Lu_3Al_2(AlO_4)_3$ and the end member $Lu_2CaMg_2(SiO_4)_3$. Here, the solid solution of the end member $Lu_3Al_2(AlO_4)_3$ and the end member $Lu_2CaMg_2(SiO_4)_3$ is specifically a compound represented by $(1-x)Lu_3Al_2 (AlO_4)_3 \cdot xLu_2CaMg_2(SiO_4)_3$.

Note that such a solid solution as above has never been known before, and moreover, cannot be conceived based on the prior art. The solid solution as above can be confirmed for the first time through experimental verification.

<Ultraviolet Ray Radiation Test>

An ultraviolet ray irradiation test of irradiating the compounds of Examples 4 to 6 with an ultraviolet ray (wavelength: 365 nm) was carried out.

When the compound of Example 4 was irradiated with the ultraviolet ray (wavelength: 365 nm), green fluorescence was visually observed. That is, the compound of Example 4 was a phosphor that radiated the yellow green light.

When the compound of Example 5 was irradiated with the ultraviolet ray (wavelength: 365 nm), yellow fluorescence was visually observed. That is, the compound of Example 5 was a phosphor that radiated the yellow light.

When the compound of Example 6 was irradiated with the ultraviolet ray (wavelength: 365 nm), orange fluorescence was visually observed. That is, the compound of Example 6 was a phosphor that radiated the orange light.

<Measurement of Excitation Characteristics and Light Emission Characteristics>

Excitation characteristics and light emission characteristics of the compounds of Examples 4 to 6 were measured in a similar way to Example 1.

Figure 9:
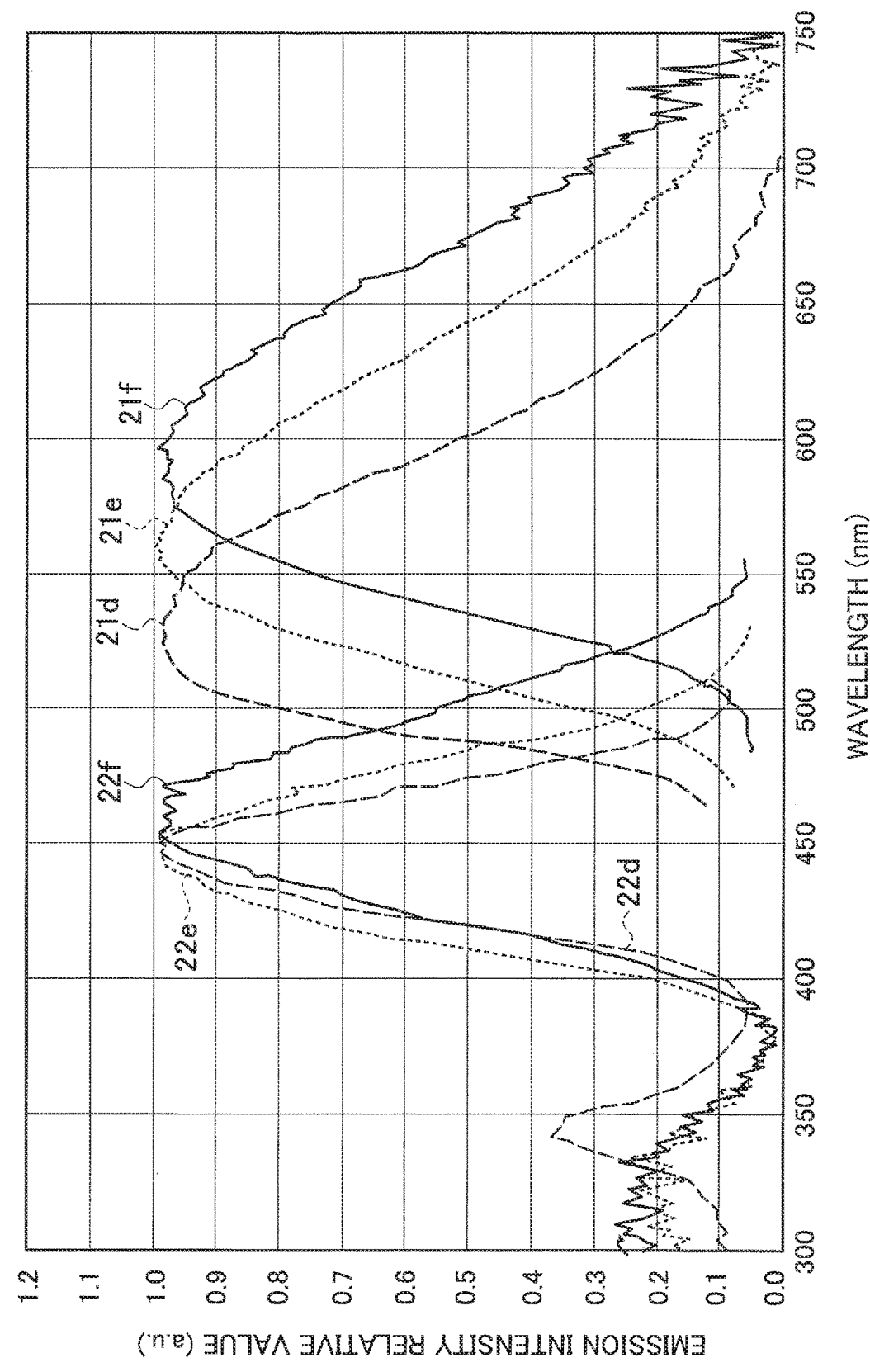
FIG. 9 is a graph showing excitation spectra and light emission spectra of the compounds of Examples 4 to 6.

FIG. 9 is a graph showing excitation spectra and light emission spectra of the compounds of Examples 4 to 6. Specifically, in FIG. 9, the light emission spectrum of the compound $0.1(Lu_{0.97}Ce_{0.03})_2CaMg_2Si_3O_{12} \cdot 0.9(Lu_{0.98}Ce_{0.02})_3Al_5O_{12}$ in Example 4 is shown as 21d, and an light emission spectrum thereof is shown as 22d. Moreover, in FIG. 9, the light emission spectrum of the compound $0.5(Lu_{0.97}Ce_{0.03})_2CaMg_2Si_3O_{12} \cdot 0.5(Lu_{0.98}Ce_{0.02})_3Al_5O_{12}$ in Example 5 is shown as 21e, and an light emission spectrum thereof is shown as 22e. Furthermore, in FIG. 9, the light emission spectrum of the compound $0.9(Lu_{0.97}Ce_{0.03})_2CaMg_2Si_3O_{12} \cdot 0.1(Lu_{0.98}Ce_{0.02})_3Al_5O_{12}$ in Example 6 is shown as 21f, and an light emission spectrum thereof is shown as 22f.

Note that an excitation wavelength at the measurement of the light emission spectrum was defined as the excitation peak wavelength, and a monitor wavelength at the measurement of the excitation spectrum was defined as the light emission peak wavelength. Moreover, both of the light emission spectra and the excitation spectra in FIG. 9 are standardized and shown while taking peak values thereof as 1.

As seen from FIG. 9, the excitation spectra of the phosphors in Examples 4 to 6 had maximum values of the excitation intensities in the wavelength region of the blue color. Specifically, the excitation spectra of the phosphors in Examples 4 to 6 had the maximum values of the excitation intensities at 446 nm (Example 4), 448 nm (Example 5) and 457 nm (Example 6), respectively. From these results, it was found that the phosphors of Examples 4 to 6 emit light strongly when irradiated with blue light.

Moreover, as seen from FIG. 9, the light emission spectra of the phosphors in Examples 4 to 6 contain the spectrum component derived from the electron energy transition of $Ce^{3+}$. This is because the light emission spectra of the phosphors in Examples 4 to 6 take a shape mainly composed of the light emission spectra derived from the electron energy transition of $Ce^{3+}$.

Then, as seen from FIG. 9, the light emission spectra of the phosphors in Examples 4 to 6 had the light emission peaks at 525 nm, 558 nm and 596 nm, respectively. From these results, it was found that the phosphors in Examples 4 to 6 were such phosphors having relatively longer light emission peak wavelengths than the $Lu_3Al_2(AlO_4)_3:Ce^{3+}$ phosphor.

As seen from FIGS. 7 to 9, with regard to the phosphors represented by $(1-x)(Lu_{0.98}Ce_{0.02})_3Al_2(AlO_4)_3 \cdot x(Lu_{0.97}Ce_{0.03})_2CaMg_2(SiO_4)_3$, the light emission peaks thereof can be controlled within a range of 525 nm or more and less than 596 nm. With regard to the phosphors represented by $(1-x)(Lu_{0.98}Ce_{0.02})_3Al_2(AlO_4)_3 \cdot x(Lu_{0.97}Ce_{0.03})_2CaMg_2(SiO_4)_3$, it is easy to control the light emission peaks thereof within a range of 560 nm or more and less than 590 nm, which is useful for enhancing lighting color rendering.

From the above results of Examples 4 to 6, it was found that the matrix garnet compound was a compound in which the end member $Lu_3Al_2(AlO_4)_3$ is entirely solid-solved with the end member $Lu_2CaMg_2(SiO_4)_3$. Moreover, from the above results of Examples 4 to 6, it was found that the light emission peak wavelengths of the phosphors composed by containing $Ce^{3+}$ in the matrix garnet compound can be controlled within a range of 515 nm or more and less than 610 nm, and in particular, a range of 525 nm or more and less than 590 nm.

Examples 7 to 10

$0.1(Lu_{0.97}Ce_{0.03})_2(Ca_{0.9}Mg_{0.1})Mg_2Si_3O_{12} \cdot 0.9(Lu_{0.98}Ce_{0.02})_3Al_5O_{12}$ was obtained in a similar way to Example 1 except that the blending ratio of the respective raw materials was changed to that in Table 1 (Example 7).

Moreover, $0.5(Lu_{0.97}Ce_{0.03})_2(Ca_{0.9}Mg_{0.1})Mg_2Si_3O_{12} \cdot 0.5(Lu_{0.98}Ce_{0.02})_3Al_5O_{12}$ was obtained in a similar way to Example 1 except that the blending ratio of the respective raw materials was changed to that in Table 1 (Example 8).

Furthermore, $0.9(Lu_{0.97}Ce_{0.03})_2(Ca_{0.9}Mg_{0.1})Mg_2Si_3O_{12} \cdot 0.1(Lu_{0.98}Ce_{0.02})_3Al_5O_{12}$ was obtained in a similar way to Example 1 except that the blending ratio of the respective raw materials was changed to that in Table 1 (Example 9).

Moreover, $(Lu_{0.97}Ce_{0.03})_2(Ca_{0.9}Mg_{0.1})Mg_2Si_3O_{12}$ was obtained in a similar way to Example 1 except that the blending ratio of the respective raw materials was changed to that in Table 1 (Example 10).

Evaluation of Examples 7 to 10

For the compounds of Examples 7 to 10, crystal structure analysis, ultraviolet ray irradiation test and measurement of light emission characteristics were carried out in a similar way to Example 1.

<Crystal Structure Analysis>

Figure 10:
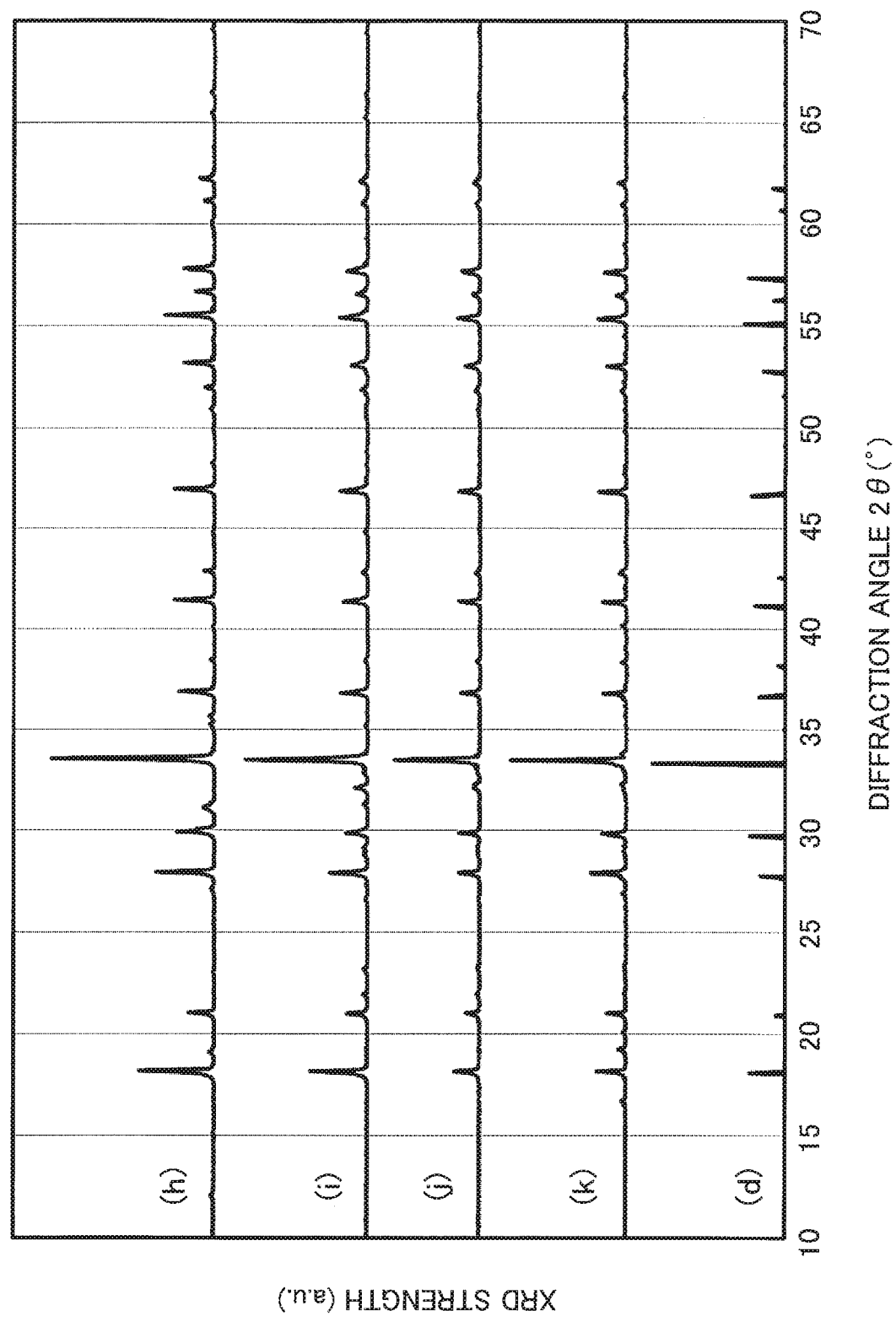
FIG. 10 is a graph showing XRD patterns of compounds of Examples 7 to 10 and the known compound.

FIG. 10 is a graph showing X-ray diffraction (XRD) patterns of the compounds of Examples 7 to 10 and a known compound.

In FIG. 10, the XRD pattern of Example 7 is shown as (h), the XRD pattern of Example 8 is shown as (i), the XRD pattern of Example 9 is shown as (j), and the XRD pattern of Example 10 is shown as (k). Moreover, as a reference, the pattern (PDF No. 33-0040) of $Al_5Y_3O_{12}$, which is registered in the PDF (Power Diffraction Files), is shown as (d).

When the respective patterns shown in FIG. 10 were compared with one another, the following facts were found. That is, it was found that the XRD patterns of Examples 7 to 10 substantially coincided with the pattern of $Al_5Y_3O_{12}$, which is shown by (d), in terms of shape features.

Such coincidence of the XRD patterns indicates that the compounds of Examples 7 to 10 are mainly composed of compounds having the same garnet structure as that of $Al_5Y_3O_{12}$. Then, in consideration of a weight ratio, it can be said that the compound of Example 7 is a solid solution of the compound $(Lu_{0.97}Ce_{0.03})_2(Ca_{0.9}Mg_{0.1})Mg_2Si_3O_{12}$ and the compound $(Lu_{0.98}Ce_{0.02})_3Al_5O_{12}$. It can be said that a specific composition of the compound of Example 7 is $0.1(Lu_{0.97}Ce_{0.03})_2(Ca_{0.9}Mg_{0.1})Mg_2Si_3O_{12} \cdot 0.9(Lu_{0.98}Ce_{0.02})_3Al_5O_{12}$.

Moreover, it can be said that the compound of Example 8 is a solid solution of the compound $(Lu_{0.97}Ce_{0.03})_2(Ca_{0.9}Mg_{0.1})Mg_2Si_3O_{12}$ and the compound $(Lu_{0.98}Ce_{0.02})_3Al_5O_{12}$. It can be said that a specific composition of the compound of Example 8 is $0.5(Lu_{0.97}Ce_{0.03})_2(Ca_{0.9}Mg_{0.1})Mg_2Si_3O_{12} \cdot 0.5(Lu_{0.98}Ce_{0.02})_3Al_5O_{12}$.

Furthermore, it can be said that the compound of Example 9 is a solid solution of the compound $(Lu_{0.97}Ce_{0.03})_2(Ca_{0.9}Mg_{0.1})Mg_2Si_3O_{12}$ and the compound $(Lu_{0.98}Ce_{0.02})_3Al_5O_{12}$. It can be said that a specific composition of the compound of Example 9 is $0.9(Lu_{0.97}Ce_{0.03})_2(Ca_{0.9}Mg_{0.1})Mg_2Si_3O_{12} \cdot 0.1(Lu_{0.98}Ce_{0.02})_3Al_5O_{12}$.

Moreover, a specific composition of the compound of Example 10 is $(Lu_{0.97}Ce_{0.03})_2(Ca_{0.9}Mg_{0.1})Mg_2Si_3O_{12}$.

Figure 11:
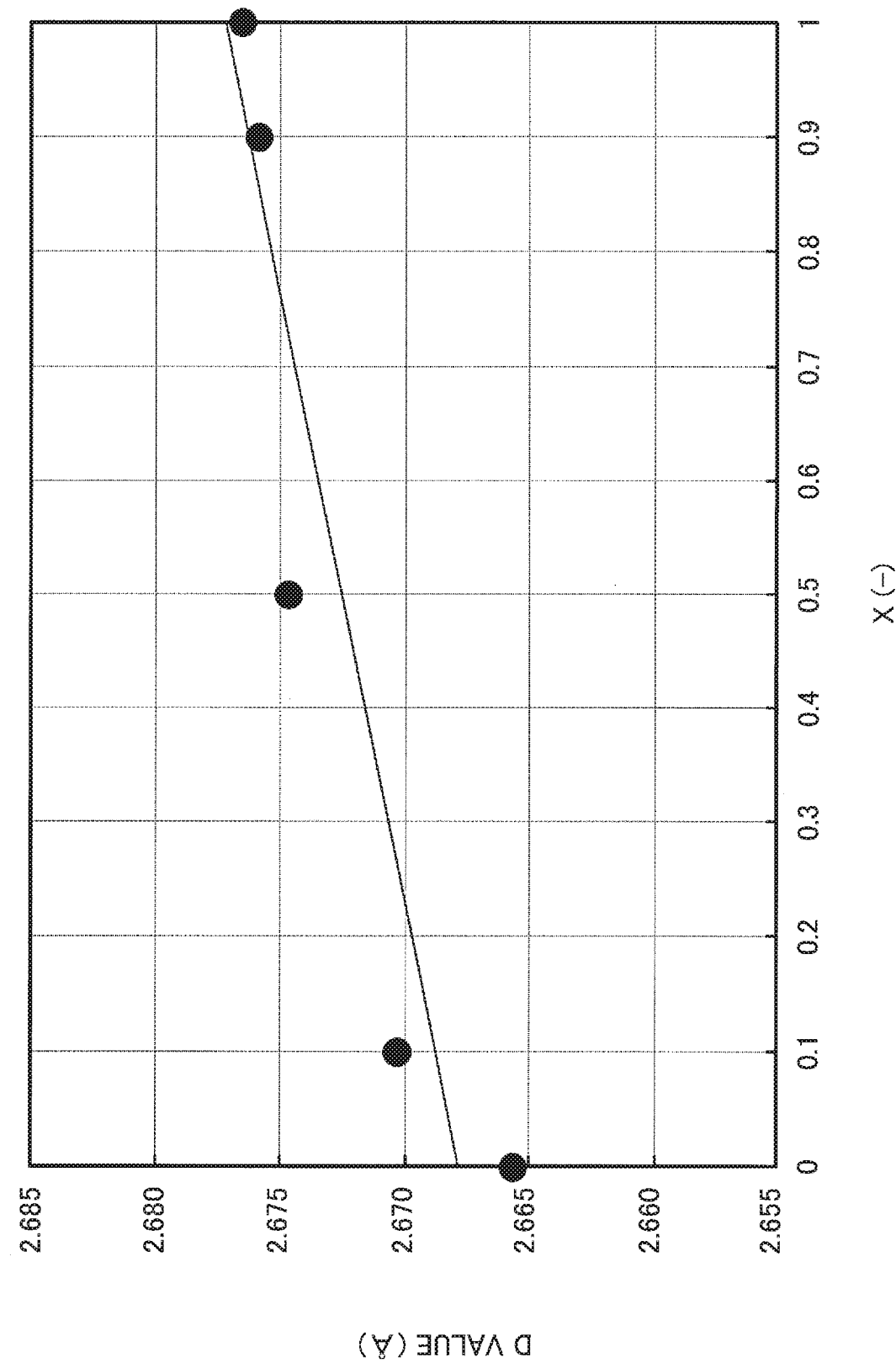
FIG. 11 is a graph showing relationships between d values of (420) planes and solid solution amounts x in the compounds of Examples 7 to 10 and Comparative example 2.

FIG. 11 is a graph showing relationships between d values of (420) planes and solid solution amounts x in the compounds of Examples 7 to 10 and Comparative example 2. Specifically, FIG. 11 is a graph showing relationships between x and the d values when the above compound is represented as a solid solution represented by $(1-x)(Lu_{0.98}Ce_{0.02})_3Al_2(AlO_4)_3 \cdot x(Lu_{0.97}Ce_{0.03})_2(Ca_{0.9}Mg_{0.1})Mg_2(SiO_4)_3$. The d values of the (420) planes are intervals of the adjacent (420) planes.

The graph of FIG. 11 was created as follows. First, the d value of the (420) planes of each of the compounds was calculated based on the XRD diffraction angle (2θ) of the main peak (the diffraction line of each of the (420) planes) near 33° of the XRD pattern of the compound. Next, such a graph showing the relationships between x and the d values was created based on the d values of the respective compounds and the compositions of the respective compounds, which are represented by $(1-x)(Lu_{0.98}Ce_{0.02})_3Al_2(AlO_4)_3 \cdot x(Lu_{0.97}Ce_{0.03})_2(Ca_{0.9}Mg_{0.1})Mg_2(SiO_4)_3$.

As shown in FIG. 11, it was found that the d value increases substantially in proportion to x. That is, as seen from FIG. 11, as x was increased, such an interplanar spacing of the (420) planes of the phosphor continuously increased.

As above, in FIG. 11, the d value increases substantially in proportion to x. Therefore, it can be said that FIG. 10 and FIG. 11 show data indicating that the compound $(Lu_{0.97}Ce_{0.03})_2(Ca_{0.9}Mg_{0.1})Mg_2Si_3O_{12}$ and the compound $(Lu_{0.98}Ce_{0.02})_3Al_5O_{12}$ form the solid solution.

Moreover, analysis results shown in FIG. 10 and FIG. 11 indicate the presence of the phosphor that contains at least $Ce^{3+}$ as a light emission center and includes, as a matrix, the solid solution of the end member $Lu_3Al_2(AlO_4)_3$ and the end member $Lu_2(Ca_{0.9}Mg_{0.1})Mg_2Si_3O_{12}$. Moreover, the analysis results shown in FIG. 10 and FIG. 11 show a synthesis fact of the phosphor. Here, the solid solution of the end member $Lu_3Al_2(AlO_4)_3$ and the end member $Lu_2(Ca_{0.9}Mg_{0.1})Mg_2(SiO_4)_3$ is specifically a compound represented by $(1-x)Lu_3Al_2(AlO_4)_3 \cdot xLu_2(Ca_{0.9}Mg_{0.1})Mg_2Si_3O_{12}$.

<Ultraviolet Ray Radiation Test>

An ultraviolet ray irradiation test of irradiating the compounds of Examples 7 to 10 with an ultraviolet ray (wavelength: 365 nm) was carried out.

When the compound of Example 7 was irradiated with the ultraviolet ray (wavelength: 365 nm), green fluorescence was visually observed. That is, the compound of Example 7 was a phosphor that radiated the green light.

When the compound of Example 8 was irradiated with the ultraviolet ray (wavelength: 365 nm), yellow fluorescence was visually observed. That is, the compound of Example 8 was a phosphor that radiated the yellow light.

When the compound of Example 9 was irradiated with the ultraviolet ray (wavelength: 365 nm), orange fluorescence was visually observed. That is, the compound of Example 9 was a phosphor that radiated the orange light.

When the compound of Example 10 was irradiated with the ultraviolet ray (wavelength: 365 nm), orange fluorescence was visually observed. That is, the compound of Example 10 was a phosphor that radiated the orange light.

<Measurement of Light Emission Characteristics>

Light emission characteristics of the compounds of Examples 7 to 10 were measured in a similar way to Example 1.

Figure 12:
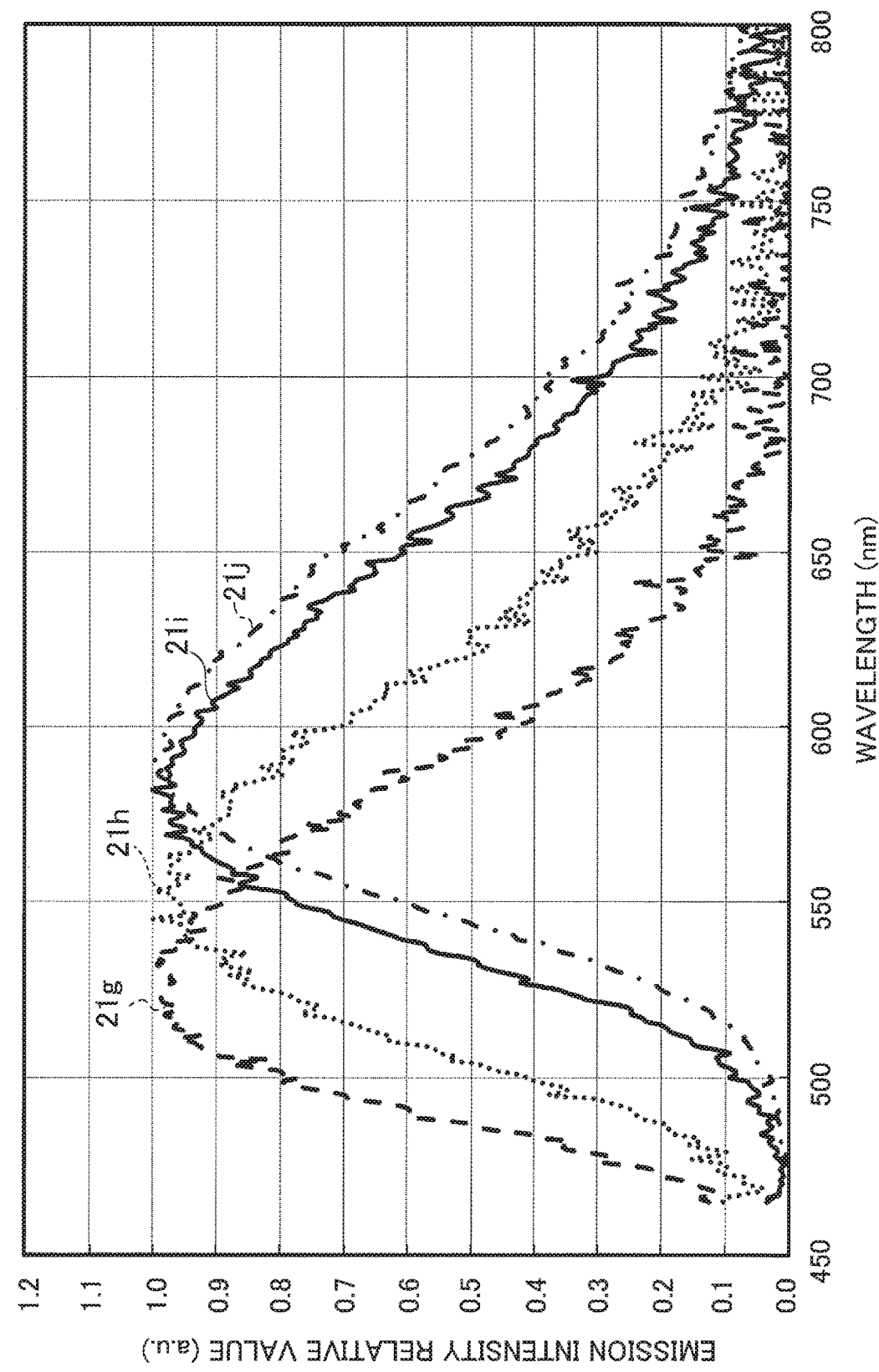
FIG. 12 is a graph showing light emission spectra of the compounds of Examples 7 to 10.

FIG. 12 is a graph showing light emission spectra of the compounds of Examples 7 to 10. Specifically, in FIG. 12, the light emission spectrum of the compound $0.1(Lu_{0.97}Ce_{0.03})_2(Ca_{0.9}Mg_{0.1})Mg_2Si_3O_{12} \cdot 0.9(Lu_{0.98}Ce_{0.02})_3Al_5O_{12}$ in Example 7 is shown as 21g. Moreover, in FIG. 12, the light emission spectrum of the compound $0.5(Lu_{0.97}Ce_{0.03})_2(Ca_{0.9}Mg_{0.1})Mg_2Si_3O_{12} \cdot 0.5(Lu_{0.98}Ce_{0.02})_3Al_5O_{12}$ in Example 8 is shown as 21h. Furthermore, in FIG. 12, the light emission spectrum of the compound $0.9(Lu_{0.97}Ce_{0.03})_2(Ca_{0.9}Mg_{0.1})Mg_2Si_3O_{12} \cdot 0.1(Lu_{0.98}Ce_{0.02})_3Al_5O_{12}$ in Example 9 is shown as 21i. Furthermore, in FIG. 12 the light emission spectrum of the compound $(Lu_{0.97}Ce_{0.03})_2(Ca_{0.9}Mg_{0.1})Mg_2Si_3O_{12}$ in Example 10 is shown as 21j.

Note that the light emission peak wavelengths were defined to be wavelengths at peak values of the light emission spectra. Moreover, both of the light emission spectra in FIG. 12 are standardized and shown while taking peak the values as 1.

Moreover, as seen from FIG. 12, the light emission spectra of the phosphors in Examples 7 to 10 contain the spectrum component derived from the electron energy transition of $Ce^{3+}$. This is because the light emission spectra of the phosphors in Examples 7 to 10 take a shape mainly composed of the light emission spectra derived from the electron energy transition of $Ce^{3+}$.

Then, as seen from FIG. 12, the light emission spectra of the phosphors in Examples 7 to 10 had the light emission peaks at 534 nm, 545 nm 582 nm and 590 nm, respectively. From these results, it was found that the phosphors in Examples 7 to 10 were such phosphors having relatively longer light emission peak wavelengths than the $Lu_3Al_2(AlO_4)_3:Ce^{3+}$ phosphor.

As seen from FIGS. 10 to 12, with regard to the phosphors represented by $(1-x)(Lu_{0.98}Ce_{0.02})_3Al_2(AlO_4)_3 \cdot (Lu_{0.97}Ce_{0.03})_2(Ca_{0.9}Mg_{0.1})Mg_2(SiO_4)_3$, the light emission peaks thereof can be controlled within a specific wavelength region. Specifically, it was found out that, with regard to the phosphors represented by the above formula, the light emission peaks thereof can be controlled within a range of 534 nm or more and less than 590 nm. With regard to the phosphors represented by the above formula, it is easy to control the light emission peaks thereof within a range of 560 nm or more and less than 590 nm, which is useful for enhancing lighting color rendering.

From the above results of Examples 7 to 10, it was found that the matrix garnet compound was a compound in which the end member $Lu_3Al_2(AlO_4)_3$ is entirely solid-solved with the end member $Lu_2(Ca_{0.9}Mg_{0.1})Mg_2(SiO_4)_3$. Moreover, from the above results of Examples 7 to 10, it was found that the light emission peak wavelengths of the phosphors composed by containing $Ce^{3+}$ in the matrix garnet compound can be controlled within a range of 515 nm or more and less than 610 nm, and in particular, a range of 534 nm or more and less than 590 nm.

(Evaluation of Temperature Quenching)

Temperature quenching was evaluated for the phosphors of Example 3, Example 6, Example 9 and Comparative examples 1 to 5. The temperature quenching was evaluated using a quantum efficiency measuring system (product name: QE-1100 made by Otsuka Electronics Co., Ltd.) provided with an instant multi-photometry system (product name: MCPD-9800 made by Otsuka Electronics Co., Ltd.). Specifically, using a heating mechanism provided in the quantum efficiency measuring system, the phosphors of Example 3, Example 6, Example 9 and Comparative examples 1 to 5 were heated from 30° C. to 200° C. in increments of 10° C. or 20° C. Then, internal quantum efficiency of each of the phosphors was measured every time when the phosphor was heated in increments of 10° C. or 20° C.

A ratio of the internal quantum efficiency when a temperature of the phosphor was 150° C. with respect to the internal quantum efficiency when the temperature of the phosphor was 30° C. was defined as an internal quantum efficiency maintenance factor (%), and was used as a measure of the temperature quenching of the phosphor. The internal quantum efficiency maintenance factor serves as an index for evaluating the temperature quenching of the phosphor. The internal quantum efficiency maintenance factor and the temperature quenching of the phosphor are in a relationship where the temperature quenching of the phosphor becomes smaller as the internal quantum efficiency maintenance factor of the phosphor is higher.

Figure 13:
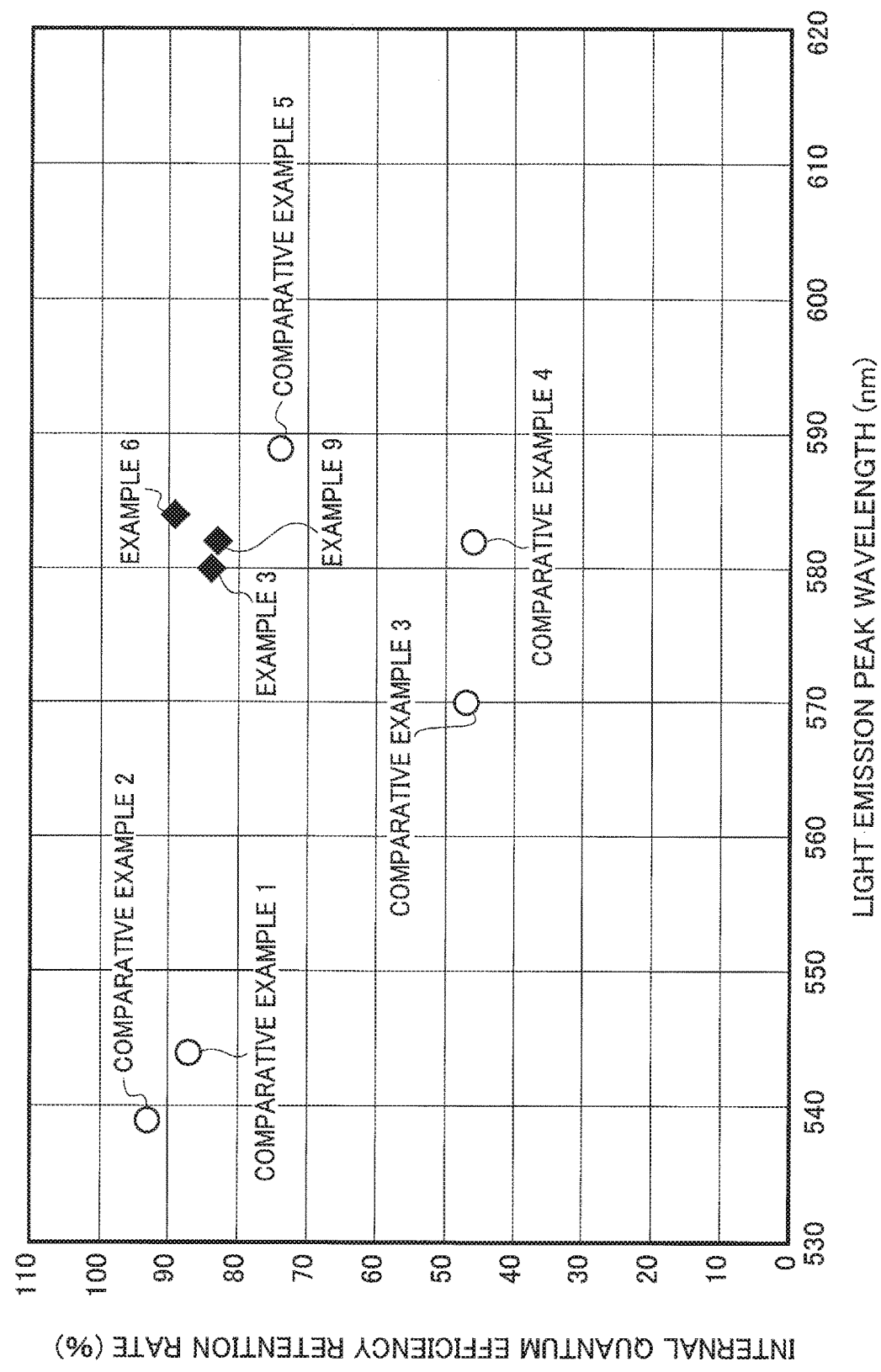
FIG. 13 is a graph showing relationships between light emission peak wavelengths and internal quantum efficiency retention rates of the compounds of Examples 3, 6 and 9 and Comparative examples 1 to 5.

FIG. 13 is a graph showing relationships between the light emission peak wavelengths and internal quantum efficiency retention rates of the compounds of Examples 3, 6 and 9 and Comparative examples 1 to 5.

Note that each of the light emission peak wavelengths shown in FIG. 13 is a maximum intensity value of the light emission spectrum of each of the phosphors, which was measured at a temperature of 25° C. by using the instant multi-photometry system.

As seen from FIG. 13, the light emission peak wavelength of the phosphor in Example 3 was relatively longer than that of the phosphor in Comparative example 1. Moreover, it was seen that the internal quantum efficiency maintenance factor of the phosphor in Example 3 was higher than those of the phosphors in Comparative examples 3 to 5.

From these results, it was found that the phosphor in Example 3 was such a phosphor, in which the light emission peak wavelength was relatively longer than that of the $Y_3Al_2(AlO_4)_3:Ce^{3+}$ phosphor, and the temperature quenching was improved in comparison with the other garnet phosphors which emit the same light color.

Moreover, from the results shown in FIG. 13, it is suggested that the phosphor containing at least $Ce^{3+}$ as a light emission center and including, as a matrix, the solid solution of the end member $Y_3Al_2(AlO_4)_3$ and the end member $Lu_2CaMg_2(SiO_4)_3$ has the following characteristics. That is, it is suggested that the phosphor including the above solid solution as a matrix is such a phosphor, in which the light emission peak wavelength is 560 nm or more that is relatively longer than that of the $Y_3Al_2(AlO_4)_3:Ce^{3+}$ phosphor, and the temperature quenching was improved in comparison with the other garnet phosphors which emit the same light color. Heretofore, such a phosphor has never been known, which simultaneously achieves the characteristics that the light emission peak wavelength becomes 560 nm or more and the characteristics that the temperature quenching is improved in comparison with the other garnet phosphors which emit the same light color. Note that the solid solution of the end member $Y_3Al_2(AlO_4)_3$ and the end member $Lu_2CaMg_2(SiO_4)_3$ is specifically the compound represented by $(1-x)Y_3Al_2(AlO_4)_3 \cdot xLu_2CaMg_2(SiO_4)_3$.

Moreover, as seen from FIG. 13, the light emission peak wavelength of the phosphor in Example 6 was relatively longer than that of the phosphor in Comparative example 2. Moreover, it was seen that the internal quantum efficiency maintenance factor of the phosphor in Example 6 was higher than those of the phosphors in Comparative examples 3 to 5.

From these results, it was found that the phosphor in Example 6 was such a phosphor, in which the light emission peak wavelength was relatively longer than that of the $Lu_3Al_2(AlO_4)_3:Ce^{3+}$ phosphor, and the temperature quenching was improved in comparison with the other garnet phosphors which emit the same light color.

Moreover, from the results shown in FIG. 13, it is suggested that the phosphor containing at least $Ce^{3+}$ as a light emission center and including, as a matrix, the solid solution of the end member $Lu_3Al_2(AlO_4)_3$ and the end member $Lu_2CaMg_2(SiO_4)_3$ has the following characteristics. That is, it is suggested that the phosphor including the above solid solution as a matrix is such a phosphor, in which the light emission peak wavelength is 560 nm or more that is relatively longer than that of the $Lu_3Al_2(AlO_4)_3:Ce^{3+}$ phosphor, and the temperature quenching was improved. Heretofore, such a phosphor has never been known, which simultaneously achieves the characteristics that the light emission peak wavelength becomes 560 nm or more and the characteristics that the temperature quenching is improved in comparison with the other garnet phosphors which emit the same light color. Note that the solid solution of the end member $Lu_3Al_2(AlO_4)_3$ and the end member $Lu_2CaMg_2(SiO_4)_3$ is specifically a compound represented by $(1-x)Lu_3Al_2(AlO_4)_3 \cdot xLu_2CaMg_2(SiO_4)_3$.

Moreover, as seen from FIG. 13, the light emission peak wavelength of the phosphor in Example 9 was relatively longer than that of the phosphor in Comparative example 2. Moreover, it was seen that the internal quantum efficiency maintenance factor of the phosphor in Example 9 was higher than those of the phosphors in Comparative examples 3 to 5.

From these results, it was found that the phosphor in Example 9 was such a phosphor, in which the light emission peak wavelength was relatively longer than that of the $Lu_3Al_2(AlO_4)_3:Ce^{3+}$ phosphor, and the temperature quenching was improved in comparison with the other garnet phosphors which emit the same light color.

Moreover, from the results shown in FIG. 13, it is suggested that the phosphor containing at least $Ce^{3+}$ as a light emission center and including, as a matrix, the solid solution of the end member $Lu_3Al_2(AlO_4)_3$ and the end member $Lu_2(Ca_{0.9}Mg_{0.1})Mg_2(SiO_4)_3$ has the following characteristics. That is, it is suggested that the phosphor including the above solid solution as a matrix is such a phosphor, in which the light emission peak wavelength is 560 nm or more that is relatively longer than that of the $Lu_3Al_2(AlO_4)_3:Ce^{3+}$ phosphor, and the temperature quenching was improved. Heretofore, such a phosphor has never been known, which simultaneously achieves the characteristics that the light emission peak wavelength becomes 560 nm or more and the characteristics that the temperature quenching is improved in comparison with the other garnet phosphors which emit the same light color. Note that the solid solution of the end member $Lu_3Al_2(AlO_4)_3$ and the end member $Lu_2(Ca_{0.9}Mg_{0.1})Mg_2(SiO_4)_3$ is specifically a compound represented by $(1-x)Lu_3Al_2(AlO_4)_3 \cdot xLu_2(Ca_{0.9}Mg_{0.1})Mg_2(SiO_4)_3$.

From Examples 1 to 10 described above, it was found that the phosphor according to this embodiment was capable of adopting varieties of modification examples, solid solutions and the like in terms of the composition and the type of the light emission center.

The entire contents of Japanese Patent Application No. 2016-044532 (filed on: Mar. 8, 2016) are incorporated herein by reference.

Although the contents of this embodiment have been described above in accordance with the examples, it is obvious to those skilled in the art that this embodiment is not limited to the description of these and that various modifications and improvements are possible.

INDUSTRIAL APPLICABILITY

In accordance with the phosphor according to the present invention, such a novel garnet phosphor can be provided, in which the light emission peak wavelength is relatively long, and the temperature quenching is improved. In accordance with the light emitting device according to the present invention, such a light emitting device can be provided, which emits output light in which a ratio of yellow to red light emission components is particularly large using the phosphor in which the light emission peak wavelength is relatively long, and the temperature quenching is improved.

Moreover, in accordance with the light emitting device according to the present invention, use of the phosphor according to the present invention makes it possible to obtain a variety of light emitting devices excellent particularly in exhibition performance for yellow to orange light components. Therefore, the phosphor and the light emitting device according to the present invention are useful for an illumination light source, a light emitting source, and an electronic instrument using these.

REFERENCE SIGNS LIST

2 PHOSPHOR
3 EXCITATION LIGHT
4 OUTPUT LIGHT
114, 114A, 114B, 114C LIGHT EMITTING DEVICE
117 EXCITATION SOURCE

The invention claimed is:

1. A phosphor composed by containing $Ce^{3+}$ as a light emission center in a matrix garnet compound having a garnet structure,
wherein the matrix garnet compound is represented by a general formula (1):

$$(1-x)Y_3Al_2(AlO_4)_3 \cdot xLu_2CaMg_2(SiO_4)_3 \ldots \qquad (1)$$

(where x is a numerical value that satisfies $0.1 \leq x \leq 0.9$), and
a light emission peak wavelength of the phosphor is within a range of 535 nm or more and less than 610 nm.

2. A light emitting device, wherein the phosphor according to claim 1 is used.

3. The light emitting device according to claim 2, comprising:
a solid-state light emitting device,
wherein the phosphor is excited by light radiated by the solid-state light emitting device.

4. A phosphor composed by containing $Ce^{3+}$ as a light emission center in a matrix garnet compound having a garnet structure,
wherein the matrix garnet compound is represented by a general formula (2):

$$(1-x)Lu_3Al_2(AlO_4)_3 \cdot xLu_2CaMg_2(SiO_4)_3 \ldots \qquad (2)$$

(where x is a numerical value that satisfies $0.1 \leq x \leq 0.9$), and
a light emission peak wavelength of the phosphor is within a range of 515 nm or more and less than 610 nm.

5. A phosphor composed by containing $Ce^{3+}$ as a light emission center in a matrix garnet compound having a garnet structure,
wherein the matrix garnet compound is represented by a general formula (4):

$$(1-x)(Lu_{1-c}Ce_c)_3Al_2(AlO_4)_3 \cdot x(Lu_{1-d}Ce_d)_2CaMg_2(SiO_4)_3 \qquad (4)$$

(where x is a numerical value that satisfies $0.1 \leq x \leq 0.9$, c is a numerical value that satisfies $0 \leq c \leq 0.2$, d is a numerical value that satisfies $0 \leq d \leq 0.2$, and c+d is a numerical value that satisfies $0 < c+d \leq 0.4$), and
a light emission peak wavelength of the phosphor is within a range of 515 nm or more and less than 610 nm.

6. A phosphor composed by containing $Ce^{3+}$ as a light emission center in a matrix garnet compound having a garnet structure,
wherein the matrix garnet compound is represented by a general formula (1A):

$$(1-x)Y_3Al_2(AlO_4)_3 \cdot xLu_2(Ca_eMg_{1-e})Mg_2(SiO_4)_3 \ldots \qquad (1A)$$

(where x is a numerical value that satisfies $0.1 \leq x \leq 0.9$, and e is a numerical value that satisfies $0 < e < 1$), and
a light emission peak wavelength of the phosphor is within a range of 535 nm or more and less than 610 nm.

7. A phosphor composed by containing $Ce^{3+}$ as a light emission center in a matrix garnet compound having a garnet structure,
wherein the matrix garnet compound is represented by a general formula (2A):

$$(1-x)Lu_3Al_2(AlO_4)_3 \cdot xLu_2(Ca_eMg_{1-e})Mg_2(SiO_4)_3 \ldots \qquad (2A)$$

(where x is a numerical value that satisfies $0.1 \leq x \leq 0.9$, and e is a numerical value that satisfies $0 < e < 1$), and
a light emission peak wavelength of the phosphor is within a range of 515 nm or more and less than 610 nm.

8. A phosphor composed by containing $Ce^{3+}$ as a light emission center in a matrix garnet compound having a garnet structure,
wherein the matrix garnet compound is represented by a general formula (4A):

$$(1-x)(Lu_{1-c}Ce_c)_3Al_2(AlO_4)_3 - x(Lu_{1-d}Ce_d)_2(Ca_eMg_{1-e})Mg_2(SiO_4)_3 \qquad (4A)$$

(where x is a numerical value that satisfies $0.1 \leq x \leq 0.9$, c is a numerical value that satisfies $0 \leq c \leq 0.2$, d is a numerical value that satisfies $0 \leq d \leq 0.2$, c+d is a numerical value that satisfies $0 < c+d \leq 0.4$, and e is a numerical value that satisfies $0 < e < 1$), and
a light emission peak wavelength of the phosphor is within a range of 515 nm or more and less than 610 nm.

* * * * *